US012062553B2

(12) United States Patent
Melcer et al.

(10) Patent No.: US 12,062,553 B2
(45) Date of Patent: Aug. 13, 2024

(54) METHOD OF MANUFACTURING SEMICONDUCTORS USING FLUID DELIVERY SYSTEM

(71) Applicant: Ichor Systems, Inc., Fremont, CA (US)

(72) Inventors: Chris Melcer, Santa Cruz, CA (US); Phillip Ryan Barros, Pleasanton, CA (US); Haruyuki Kubota, San Francisco, CA (US); Randolph Treur, San Luis Obispo, CA (US); Todd Mark Cushman, Santa Clara, CA (US)

(73) Assignee: ICHOR SYSTEMS, INC.

( * ) Notice: Subject to any disclaimer, the term of this patent is extended or adjusted under 35 U.S.C. 154(b) by 243 days.

(21) Appl. No.: 17/495,126

(22) Filed: Oct. 6, 2021

(65) Prior Publication Data

US 2022/0028705 A1 Jan. 27, 2022

Related U.S. Application Data

(63) Continuation of application No. 17/197,648, filed on Mar. 10, 2021, now Pat. No. 11,158,522, which is a continuation of application No. 16/151,863, filed on Oct. 4, 2018, now Pat. No. 11,158,521, which is a continuation of application No. PCT/US2017/026022, filed on Apr. 4, 2017.

(60) Provisional application No. 62/318,202, filed on Apr. 4, 2016.

(51) Int. Cl.
*H01L 21/67* (2006.01)
*F16J 15/10* (2006.01)
*F16K 27/00* (2006.01)

(52) U.S. Cl.
CPC ...... *H01L 21/67017* (2013.01); *F16J 15/104* (2013.01); *F16J 15/106* (2013.01); *F16K 27/003* (2013.01); *Y10T 137/5109* (2015.04); *Y10T 137/5283* (2015.04)

(58) Field of Classification Search
CPC . F16K 27/003; F16J 15/10; F16J 15/104–106
See application file for complete search history.

(56) References Cited

U.S. PATENT DOCUMENTS

| 5,466,018 | A | 11/1995 | Stobbart |
| 5,839,765 | A | 11/1998 | Carter et al. |
| 6,161,875 | A | 12/2000 | Yamaji et al. |
| 6,234,545 | B1 | 5/2001 | Babuder |
| 6,415,822 | B1 * | 7/2002 | Hollingshead ........ F16K 27/003 |
| | | | 285/120.1 |

(Continued)

FOREIGN PATENT DOCUMENTS

| CN | 101255929 A | 9/2008 |
| JP | S5947593 A | 3/1984 |

(Continued)

OTHER PUBLICATIONS

Office Action dated Apr. 10, 2023 in corresponding U.S. Appl. No. 17/887,068.

(Continued)

*Primary Examiner* — Kevin F Murphy
(74) *Attorney, Agent, or Firm* — The Belles Group, P.C.

(57) ABSTRACT

A method of processing semiconductors using a fluid delivery system is disclosed in which seal inserts are utilized to fluidly connect an active component that bridges two substrate blocks.

20 Claims, 26 Drawing Sheets

(56) References Cited

U.S. PATENT DOCUMENTS

| | | |
|---|---|---|
| 6,450,507 B2 | 9/2002 | Johnson |
| 6,546,961 B2 | 4/2003 | Fukushima |
| 7,320,339 B2 * | 1/2008 | Milburn ............... F17D 1/04 |
| | | 137/884 |
| 7,581,764 B2 | 9/2009 | Ishihara |
| 8,246,087 B1 | 8/2012 | Yamaji et al. |
| 8,281,816 B2 | 10/2012 | Nakata et al. |
| 8,336,573 B2 | 12/2012 | Ellis |
| 8,726,935 B2 * | 5/2014 | Leys ................. F16K 11/20 |
| | | 251/61.4 |
| 9,488,302 B2 | 11/2016 | Gjerstad et al. |
| 10,190,708 B2 | 1/2019 | Fujii et al. |
| 10,704,712 B1 | 7/2020 | Boulanger |
| 2002/0017329 A1 | 2/2002 | Fukushima |
| 2005/0241707 A1 | 11/2005 | Harris |
| 2005/0242519 A1 | 11/2005 | Koleilat et al. |
| 2006/0011246 A1 | 1/2006 | Leys |
| 2007/0262581 A1 | 11/2007 | Ishihara |
| 2007/0295401 A1 | 12/2007 | Okumura et al. |
| 2008/0000533 A1 | 1/2008 | Katsura |
| 2008/0202614 A1 | 8/2008 | Mamyo et al. |
| 2008/0295963 A1 | 12/2008 | Moriya et al. |
| 2008/0296351 A1 | 12/2008 | Crockett et al. |
| 2013/0276928 A1 | 10/2013 | Vu |
| 2013/0285369 A1 | 10/2013 | Gjerstad et al. |
| 2015/0176744 A1 | 6/2015 | Glassman et al. |
| 2017/0159854 A1 | 6/2017 | Fujii et al. |
| 2021/0159093 A1 | 5/2021 | Mercer et al. |
| 2021/0193487 A1 | 6/2021 | Melcer et al. |

FOREIGN PATENT DOCUMENTS

| | | |
|---|---|---|
| JP | H07504481 A | 5/1995 |
| JP | H9-264440 A | 10/1997 |
| JP | H11280967 A | 10/1999 |
| JP | 2000146051 A | 5/2000 |
| JP | 2002-048299 A | 2/2002 |
| JP | 2003322127 A | 11/2003 |
| JP | 2005140230 A | 6/2005 |
| JP | 2005-240989 A | 9/2005 |
| JP | 2005-326005 A | 11/2005 |
| JP | 2006022926 A | 1/2006 |
| JP | 2006132662 A | 5/2006 |
| JP | 2006153180 | 6/2006 |
| JP | 2006153180 A | 6/2006 |
| JP | 2006307983 | 11/2006 |
| JP | 2007024307 A | 2/2007 |
| JP | 2007139196 A | 6/2007 |
| JP | 2007292217 A | 11/2007 |
| JP | 2008039100 A | 2/2008 |
| JP | 2008105401 A | 5/2008 |
| JP | 2008210982 A | 9/2008 |
| JP | 2010017939 A | 1/2010 |
| JP | 2010203533 A | 9/2010 |
| JP | 2011503449 | 1/2011 |
| JP | 2011149554 A | 8/2011 |
| JP | 2015078928 A | 4/2015 |
| JP | 5883907 B1 | 3/2016 |
| JP | 201670388 | 5/2016 |
| JP | 2016070386 A | 5/2016 |
| WO | 2006059362 A1 | 6/2006 |
| WO | WO2017/176815 | 10/2017 |
| WO | WO2019/176259 | 9/2019 |
| WO | WO2019/187504 | 10/2019 |

OTHER PUBLICATIONS

Office Action dated Mar. 28, 2023 in corresponding Japanese Patent Application No. 2022-004686.

* cited by examiner

METHOD OF MANUFACTURING SEMICONDUCTORS USING FLUID DELIVERY SYSTEM

CROSS-REFERENCE TO RELATED PATENT APPLICATIONS

The present application is a continuation of U.S. Nonprovisional patent application Ser. No. 17/197,648, filed Mar. 10, 2021, which in turn is a continuation of U.S. Nonprovisional patent application Ser. No. 16/151,863, filed Oct. 4, 2018, which in turn is a continuation of Patent Cooperation Treaty Patent Application Serial No. PCT/US2017/026022, filed Apr. 4, 2017, which in turn claims the benefit of U.S. Provisional Patent Application Ser. No. 62/318,202, filed Apr. 4, 2016, the entireties of which are hereby incorporated by reference.

TECHNICAL FIELD OF THE INVENTION

The present invention is directed to liquid chemical delivery systems.

BACKGROUND OF THE INVENTION

Liquid delivery and distribution systems are used in a variety of applications, including the manufacture of semiconductor devices, the manufacture of pharmaceutical compounds, etc. For example, semiconductor wafers are subjected to various liquid treatment processes such as etching, cleaning, polishing, drying and material deposition during their manufacturing process. Semiconductor substrate processing generally requires that liquid chemicals must be delivered in precise amounts on demand, be free of bubbles, be of a uniform thickness on the usable part of the substrate and minimize chemical waste due to cost and environmental concerns.

Various types of liquid delivery systems are used to deliver liquid chemicals from supply sources to processes using various types of active components such as flow controllers, pressure transducers, flow measurement sensors, pressure regulators, valves, etc. In many of these applications, the size of the liquid chemical distribution system can dramatically affect costs. For example, in the manufacture of semiconductor devices, it is typical for the liquid distribution system or certain portions thereof to be housed in an ultra-clean environment, such as a clean room. Further, because many of the liquid used in the manufacture of semiconductors are toxic, highly reactive, or both, such liquid distribution systems frequently require specialized containment and venting equipment. For such systems, any decrease in the size of the fluid distribution system is advantageous.

SUMMARY OF THE INVENTION

According to embodiments of the present invention, a modular system for enabling a distribution of liquid chemicals is provided. The system comprises a substrate block that includes at least two ports formed in a first major surface of the block and a fluid passageway extending between the two ports. The fluid pathway is preferably a smooth, seamless path where the entire volume of the fluid pathway is directly in line with the desired fluid flow so that fluid flow completely sweeps the entire flow passageway and there are no dead volumes or areas of entrapment in said fluid passageway. A substrate block can be formed from a fluoropolymer using a novel composition and manufacturing process. A sealing assembly is provided that uses a combination of a replaceable insert-type seal with a tongue and groove seal formed into the modular components.

In an aspect, a fluid delivery system may comprise a substrate block. The substrate block may comprise an upper surface; a first substrate port in the upper surface; a second substrate port in the upper surface; a substrate fluid passageway extending between the first substrate port and the second substrate port; a substrate ring defining the second substrate port; and a substrate seal channel formed in the upper surface and surrounding the substrate ring. An outer surface of the substrate ring may form an inner surface of the substrate seal channel. An active component may be selected from the group consisting of a flow controller, a pressure transducer, a flow measurement sensor, a pressure regulator, a valve, and a flow meter. The active component may comprise a lower surface; a first component port in the lower surface; a component fluid passageway extending from the first component port; a component ring defining the first component port; and a component seal channel formed in the lower surface and surrounding the component ring, an outer surface of the component ring forming an inner surface of the component seal channel. A seal ring may comprise an interior sleeve defining a sleeve fluid passageway; and an outer ring connected to and surrounding the interior sleeve so that: (1) an annular upper sleeve groove is formed between an upper portion of the outer ring and an upper portion of the interior sleeve; and (2) an annular lower sleeve groove is formed between a lower portion of the outer ring and a lower portion of the interior sleeve. The active component may be mounted to the substrate block so that: (1) the second substrate port and the first component port are aligned; and (2) the seal ring nests in each of the substrate seal channel and the component seal channel and the seal ring fluidly seals the substrate fluid passageway and the component fluid passageway.

In an aspect a fluid delivery system may comprise a substrate block. The substrate block may comprise an upper surface; a first substrate port in the upper surface; a second substrate port in the upper surface; and a substrate fluid passageway extending between the first substrate port and the second substrate port. An active component may be selected from the group consisting of a flow controller, a pressure transducer, a flow measurement sensor, a pressure regulator, a valve, and a flow meter. The active component may comprise a lower surface; a first component port in the lower surface; and a component fluid passageway extending from the first component port. A seal ring may have an outer ring. The active component may be mounted to the substrate block so that: (1) the second substrate port and the first component port are aligned and a horizontal interface is formed between the upper surface and the lower surface; (2) the seal ring surrounds each of the second substrate port and the first component port and fluidly seals the substrate fluid passageway and the component fluid passageway, the seal ring sized so that the outer ring of the seal ring is horizontally compressed and under no vertical interference.

In an aspect a method of processing semiconductors with a fluid delivery system may be provided. The method may comprise a) fluidly coupling a component inlet port in a lower surface of an active component to an outlet substrate port in an upper surface of a first substrate block to form a first fluid connection, the first substrate block comprising a first inlet substrate port and a first substrate fluid passageway extending between the first inlet substrate port and the first outlet substrate port; and b) fluidly coupling a component outlet port in the lower surface of the active component to a second inlet substrate port in an upper surface of a second substrate block to form a second fluid connection, the second substrate block comprising a second outlet substrate port and a second substrate fluid passageway extending between the second inlet substrate port and the second outlet substrate port, the active component comprising a component fluid passageway extending from the component inlet port to the component outlet port, thereby forming the fluid delivery system; and c) flowing a fluid through the fluid delivery system to process the semiconductors. Each of the first and second fluid connections may comprise a seal insert nesting in each of a substrate channel in the upper surface of the first substrate block and a component channel in the lower surface of the active component.

In another aspect, the invention may be a method of manufacturing semiconductor devices comprising: a) operably coupling a liquid chemical delivery system to a source of liquid chemical, the liquid chemical delivery system comprising: a three layer arrangement comprising a top layer of active components, a middle layer of substrate blocks which serve to form fluid connections between the active components, and a bottom layer formed by a back plane serving as a support structure for the top and middle layers; the middle layer of substrate blocks comprising first and second substrate blocks, each of the first and second substrate blocks comprising: an upper surface; a substrate inlet port in the upper surface; a substrate outlet port in the upper surface; a substrate fluid passageway extending between the substrate inlet port and the substrate outlet port; and each of the substrate outlet port and the substrate inlet port surrounded by a substrate ring and a substrate channel surrounding the substrate ring; the active components comprising a first active component comprising: a lower surface; a component inlet port in the lower surface; a component outlet port in the lower surface; a component fluid passageway extending from the component inlet port to the component outlet port; each of the component inlet port and the component outlet port surrounded by a component ring and a component channel surrounding the component ring; first and second seal inserts, each of the first and second seal inserts comprising: an interior sleeve defining a sleeve fluid passageway about an axis; an outer ring connected to and surrounding the interior sleeve so that: (1) an annular upper groove is formed between an upper portion of the outer ring and an upper portion of the interior sleeve; and (2) an annular lower groove is formed between a lower portion of the outer ring and a lower portion of the interior sleeve; the first active component bridging the first and second substrate blocks so that: (1) the substrate outlet port of the first substrate block and the component inlet port are aligned; and (2) the substrate inlet port of the second substrate block and the component outlet port are aligned; and the first seal insert fluidly sealing the substrate outlet port of the first substrate block and the component inlet port together to form a first fluid connection and the second seal insert fluidly sealing the substrate inlet port of the second substrate block and the component outlet port together to form a second fluid connection, thereby forming a portion of a flow pathway through the liquid chemical delivery system; and b) delivering the chemical liquid from the chemical liquid supply through the flow pathway of the liquid chemical delivery system to a process site to process semiconductor wafers.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

Embodiments of the present invention provide a modular, tubeless liquid chemical delivery system with a substantially smaller footprint than prior art systems.

Although modular fluid delivery systems are well known for use with gas delivery and distribution, there are a number of factors that make these prior art systems unsuitable for liquid chemical delivery systems. First, the prior art modular substrate blocks (which provide the fluid passageways) are typically made a solid from solid metal, such as stainless steel. Many of the liquid chemicals used in semiconductor manufacturing will cause metal to corrode. Also, metallic ions tend to be extracted into liquids in contact with the metal surfaces, which can result in a highly undesirable deposition of metal ions onto a wafer surface during the manufacturing process.

Figure 1A:
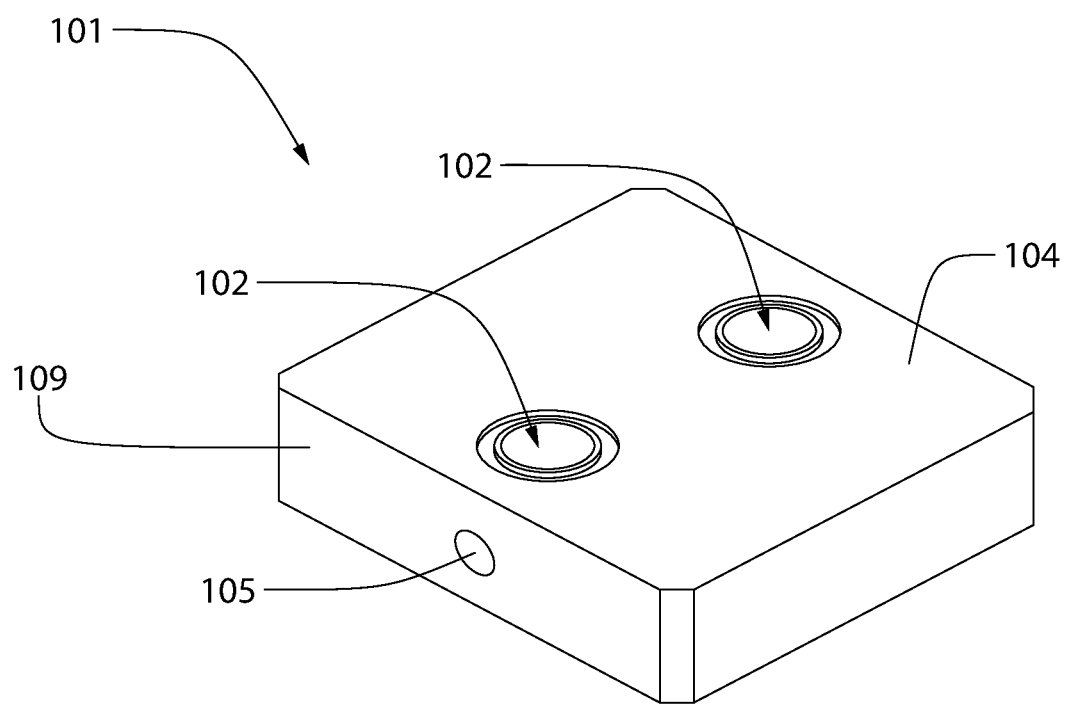
FIGS. 1A and 1B show a prior art substrate block.
Figure 1B:
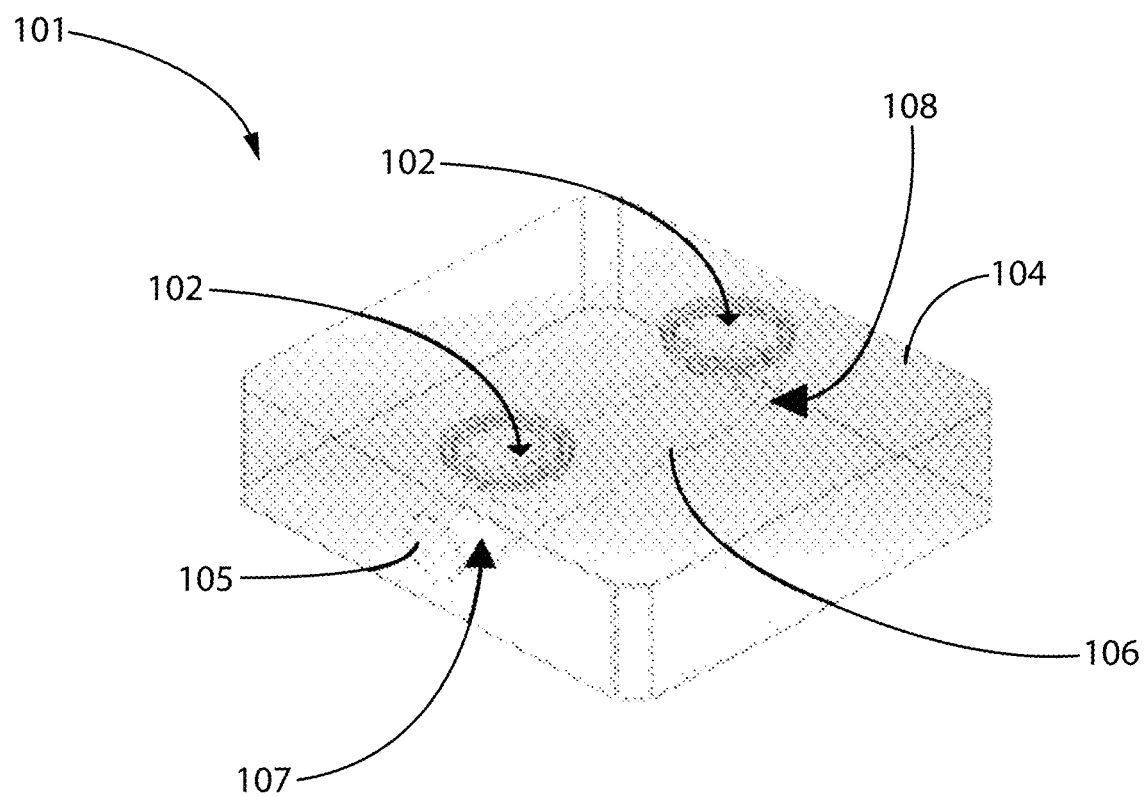

Also, fluid passageways and entrance and exit ports in prior art substrate blocks are formed by drilling into a block of material. Such a prior art substrate block 101 is shown in FIGS. 1A and 1B, with the interior passageways in FIG. 1B shown in phantom lines. As shown in FIG. 4B, drilling out the desired fluid passageways 106 results in a certain amount of "overshoot" (areas 107, 108) where the interior fluid passageway 106 joins with the entrance and exit ports 102. Drilling the interior fluid path (which runs in a direction that is parallel to the upper surface 104 of the substrate block (with ports 102) requires that the drill enter from the side 109 of the substrate block, which requires that a portion of the drilled passageway be filled with a plug 105 to isolate the desired fluid passageway. All of these factors result in some degree of undesirable dead volume within the fluid path.

Embodiments of the present invention make use of modular substrate blocks formed from a polymer or fluoropolymer such as polypropylene, PTFE, modified PTFE, or PFA. In preferred embodiments, a modular substrate block will be formed from a material that will meet the requirements found in SEMI F57 for Surface Extractable Ionic, Metallic, and Total Organic Carbon Contamination in a seven-day static leach test at 85±5° C. in Ultra-Pure Water.

Figure 4:
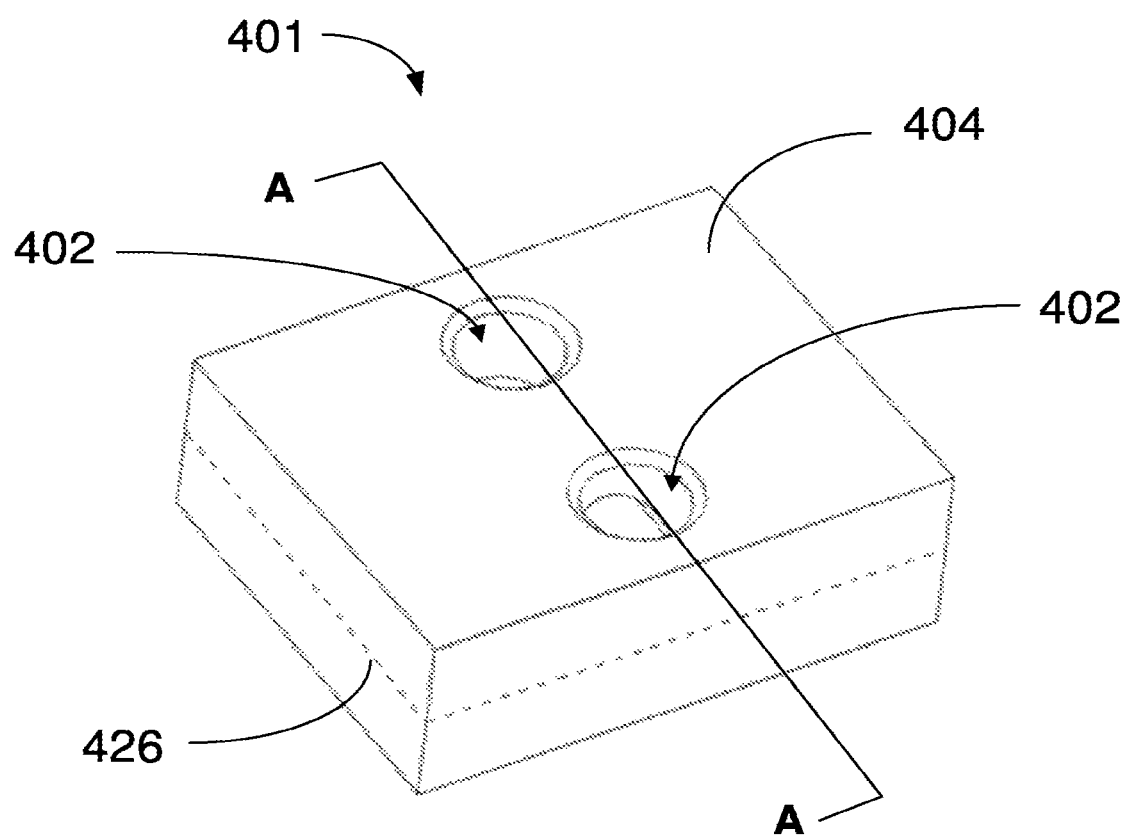
FIG. 4 shows a modular substrate block according to embodiments of the invention.

FIG. 4 shows a modular substrate block 401 according to embodiments of the present invention having a single fluid path 406 joining two ports 402 located on the upper surface 404 of the block. In some embodiments, different sized blocks can be used, with some having multiple port pairs and multiple fluid passageways within the same block.

Figure 2:
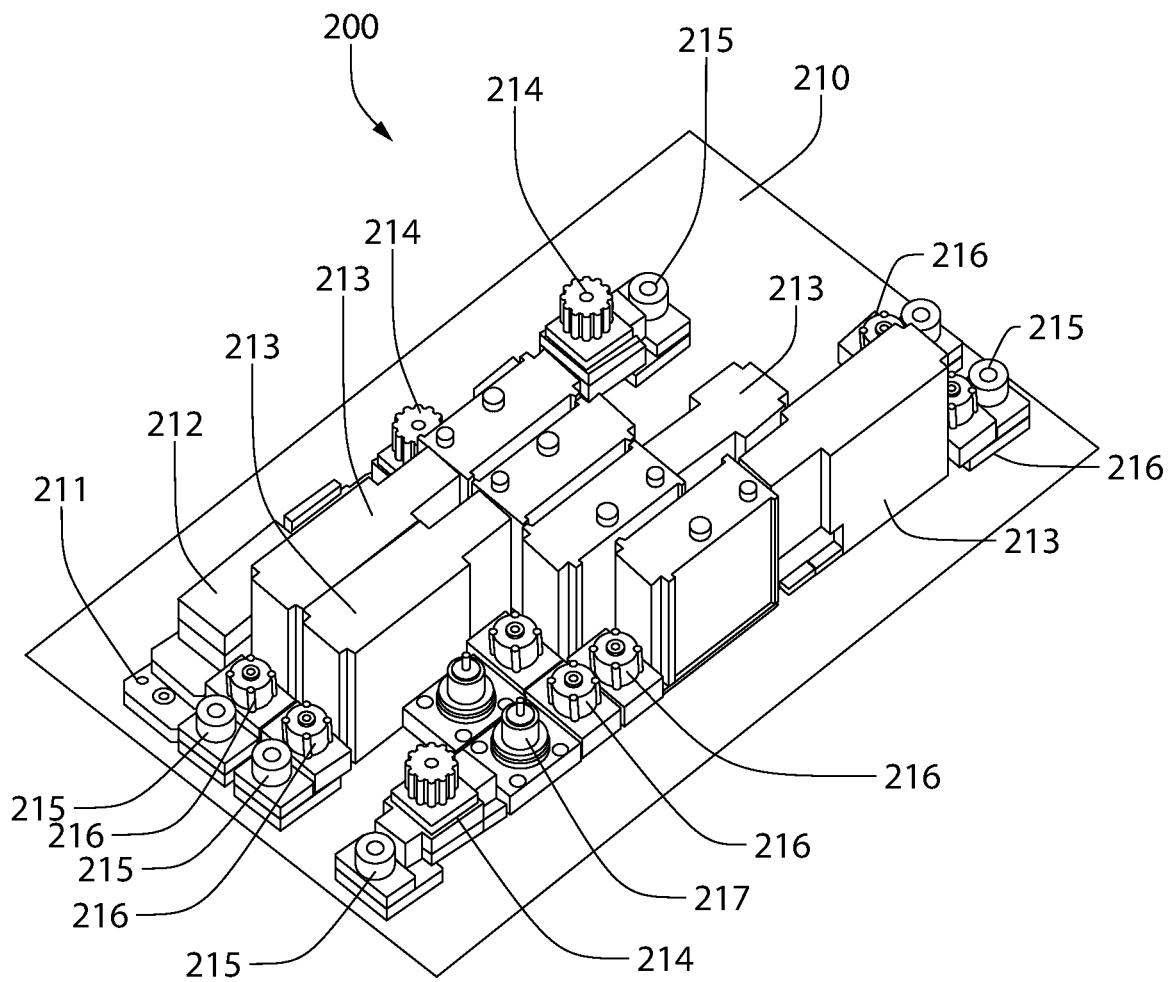
FIG. 2 is a perspective view of a modular liquid chemical delivery system according to an embodiment of the invention.
Figure 3:
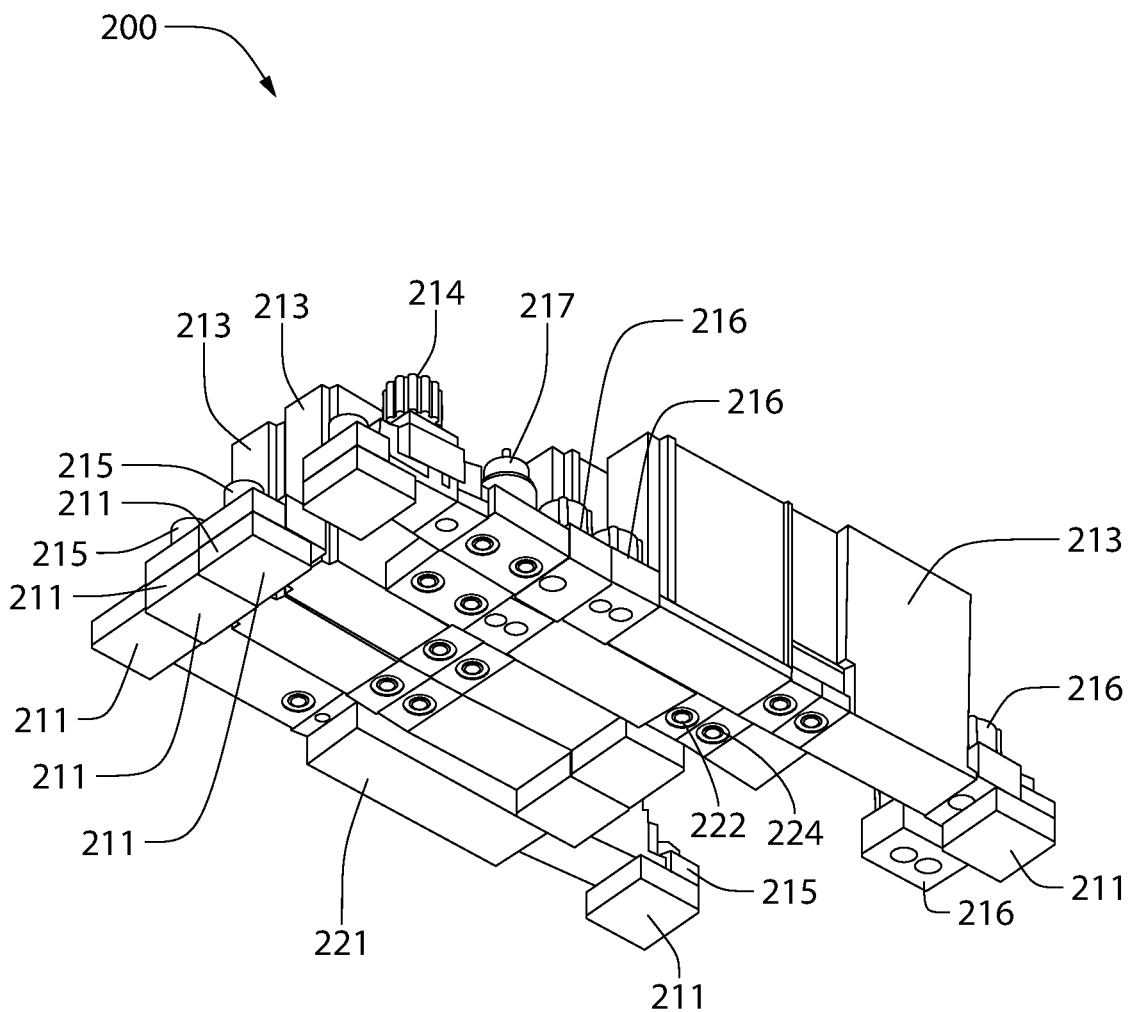
FIG. 3 is perspective bottom view of a modular liquid chemical delivery system of FIG. 1.

Referring also to FIGS. 2-3, modular substrate block 401 can be termed a "jumper block" and can be used, for example, to fluidly connect two active components (an outlet of a first active component connected to an inlet of a second active component) or to connect one active component to another substrate block. As described below, in some embodiments substrate blocks having multiple flow passageways and inlet/outlet ports can also be used.

FIG. 2 is a perspective view of a modular liquid chemical delivery system 200 according to an embodiment of the invention. FIG. 3 is perspective bottom view of the modular liquid chemical delivery system 200 of FIG. 2, without the back plane and with some of the substrate blocks not shown for clarity. In the embodiment of FIG. 2, there are three layers to the system: a top layer of active components (such as flow controllers, pressure transducers, flow measurement sensors, pressure regulators, valves, etc.); a second middle layer of substrate blocks (which serve to form the fluid connections between active components); and a back plane serving as a support structure for the entire system.

Figure 8A:
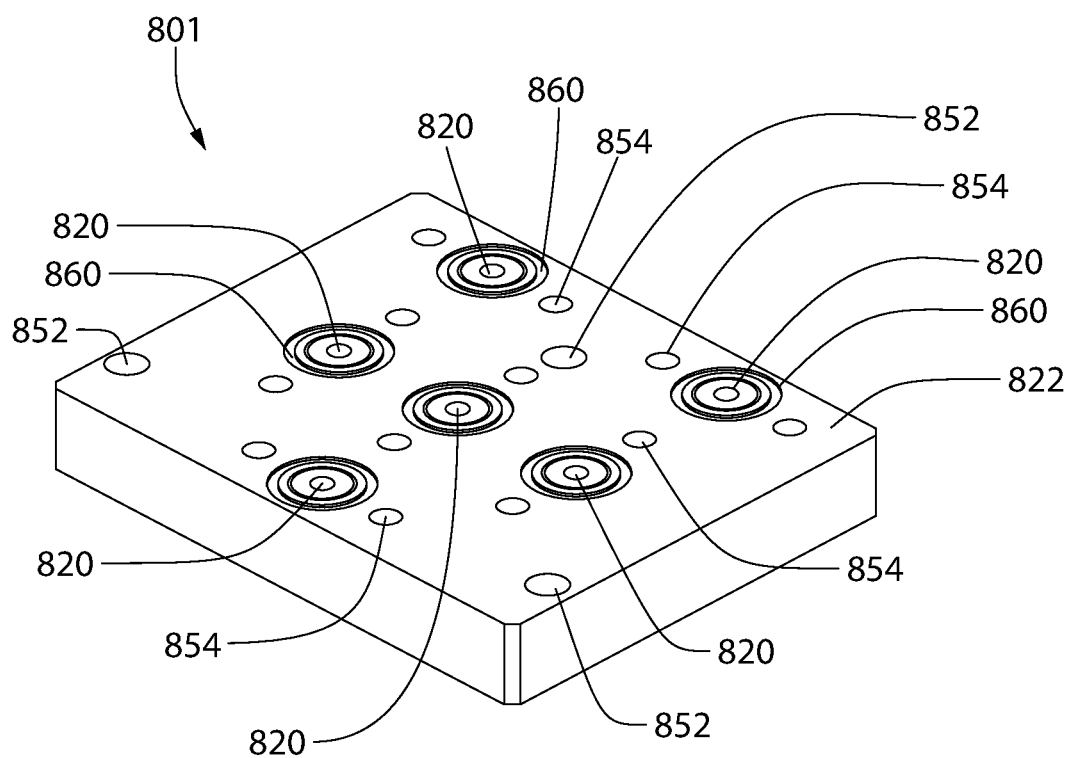
FIGS. 8A and 8B show another embodiment of a modular substrate block according to embodiments of the invention.
Figure 8B:
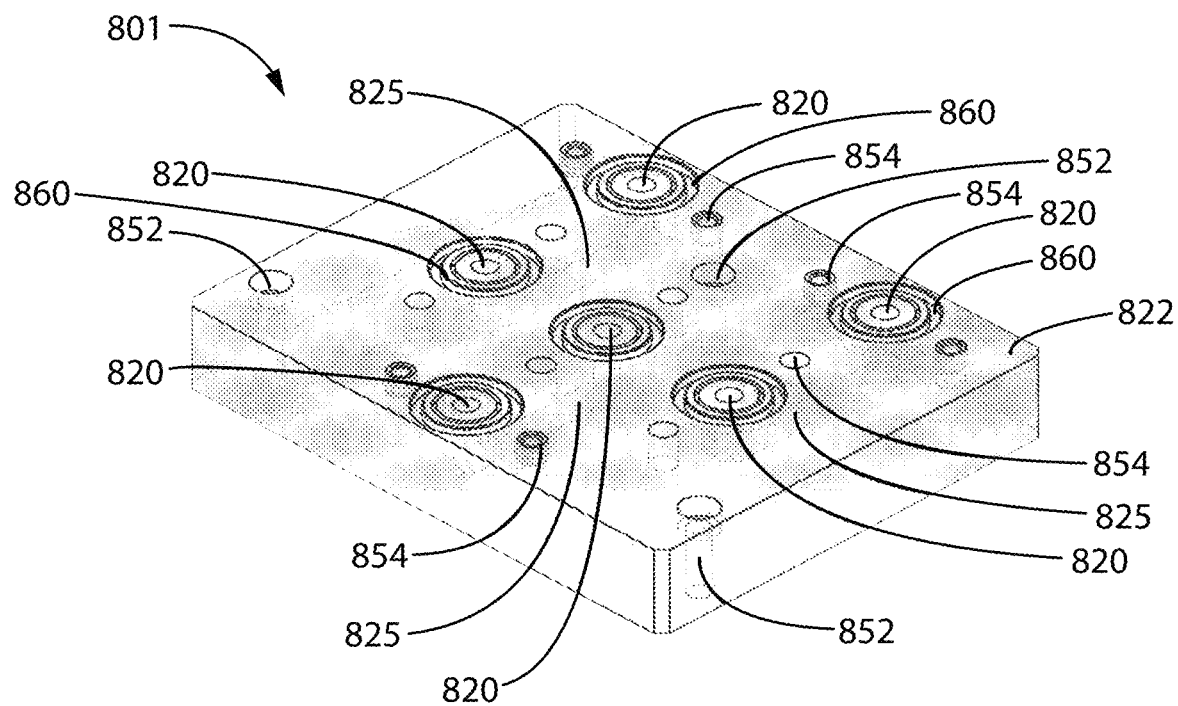

Referring also to FIGS. 8A and 8B, substrate blocks 201 are mounted to the back plane 210, typically by way of screws or other similar fasteners extending from the upper surface of the substrate (the same surface containing the inlet/outlet port) down into the back plane via fastener holes 852 to hold the substrate blocks in place. In some embodiments, adjacent substrate blocks can also be attached to each other for added stability.

Each active component (212, 213, 214, 215, 216, 217) can be held in place on one (or more) substrate blocks 201 by way of at least two screws or similar fasteners, which serve to attach the active component to the substrate block and to hold the active component in position relative to the inlet/outlet ports on the surface of the substrate block(s). Typically, an active component can be attached to a first substrate block via two screw holes 854 (also referred to as fastener holes 854) straddling either side of an inlet/outlet port and to a second substrate block (and port) in the same fashion. In some embodiments, inserts having interior metal threads can be positioned appropriately within the polymer body of the substrate block for mating with the connecting screws from the active components. In the drawings herein, fastener holes and screw holes are not shown in most figures for clarity.

The modular approach of using substrate blocks still allows direct access to each component with mounting and removing of active components requiring only a manual hand tool such as but not limited to an Allen wrench. By providing direct access to active components, it is possible to make repairs simply by removing only the damaged active component thereby reducing down time. Because the substrate blocks are standardized, active components can be placed anywhere within the system.

In the embodiment of FIG. 2, liquid connections to and from the liquid chemical delivery system are made via fittings 215. One or more liquid chemicals to be used in a process will typically flow through tubing from a storage tank (not shown). The tubing will be connected to system 200 via a fitting 215. Once the liquid chemicals enter system 200, it will flow through the various active components via the arranged substrate blocks, until it is delivered (also via fittings 215) to one or more delivery tubes to the desired processing site. In the embodiment of FIG. 2, active components include regulators 214, pressure transducers 217, valves 216, liquid flow controllers 213, and a flow meter 212. As used herein, the total area taken up by all the system components of a liquid delivery system (including active components and substrate blocks) and the free space between such components from the inlet fittings to the outlet fittings is referred to as the system "footprint."

Although substrate blocks can be formed in virtually any desired size and configuration using the methods described herein, in the embodiment of FIG. 4 substrate blocks are approximately 55 mm wide and 25 mm (1 inch) thick. The internal diameter of the flow path can be any desired size, including for example ¼", ⅜", or ½".

Significantly, in preferred embodiments, the interior fluid path is a smooth, substantially seamless passageway where the entire volume of the path is directly in line with the desired fluid flow. In other words, there are no dead volume areas or plugged portions as seen in the prior art structure of FIG. 1B. Especially for slurries, dead volumes can result in trapped particles and an undesirable increase in large particle counts. Substrate blocks according to embodiments of the present invention contribute <0.1 particle/ml (Particle size>0.1 μm) within 300 liters of flushing.

Figure 5A:
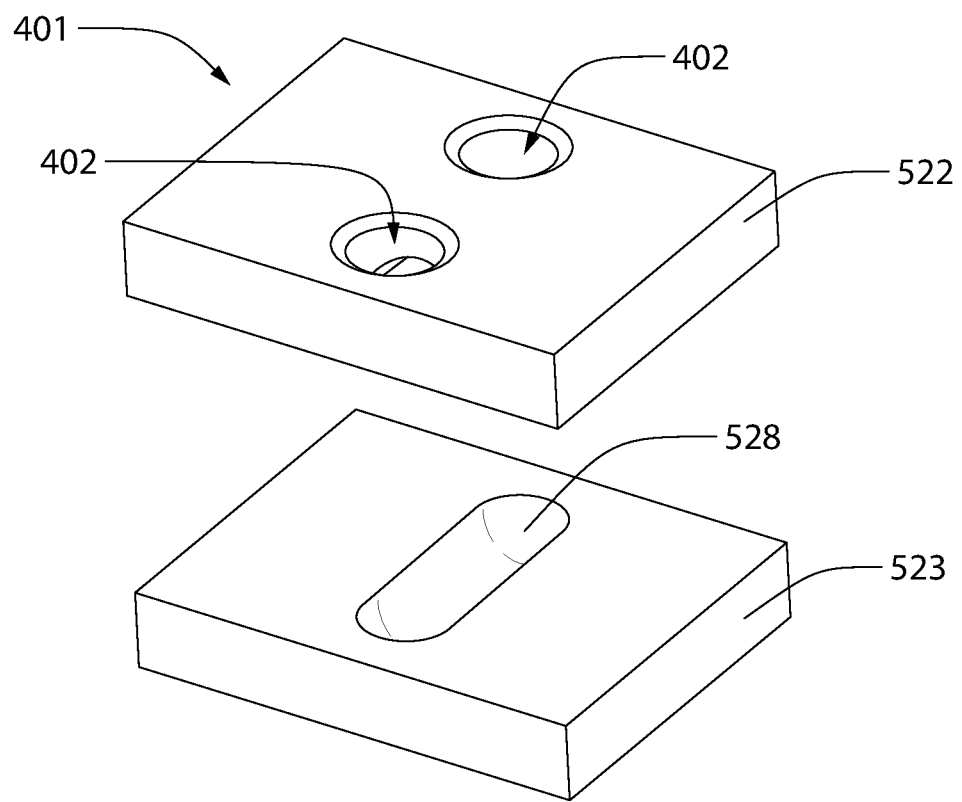
FIGS. 5A and 5B show an exploded view of the substrate block of FIG. 4.
Figure 5B:
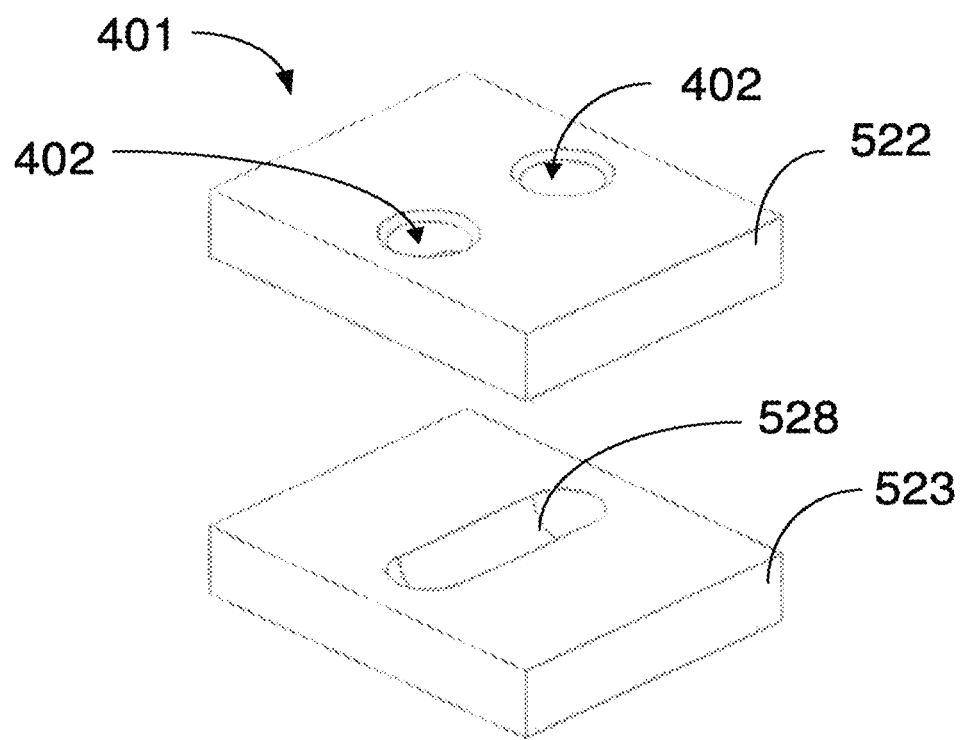
Figure 6A:
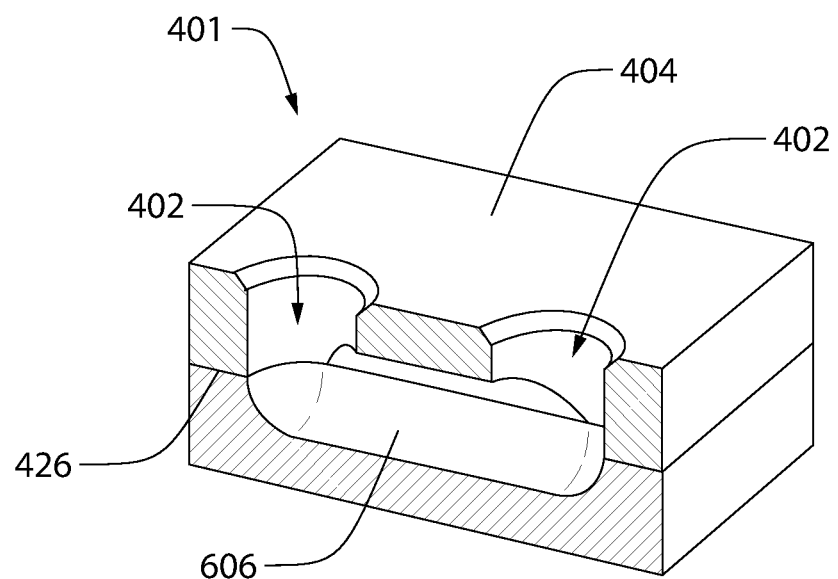
FIGS. 6A and 6B show perspective views of a cross section of the substrate block of FIG. 4.
Figure 6B:
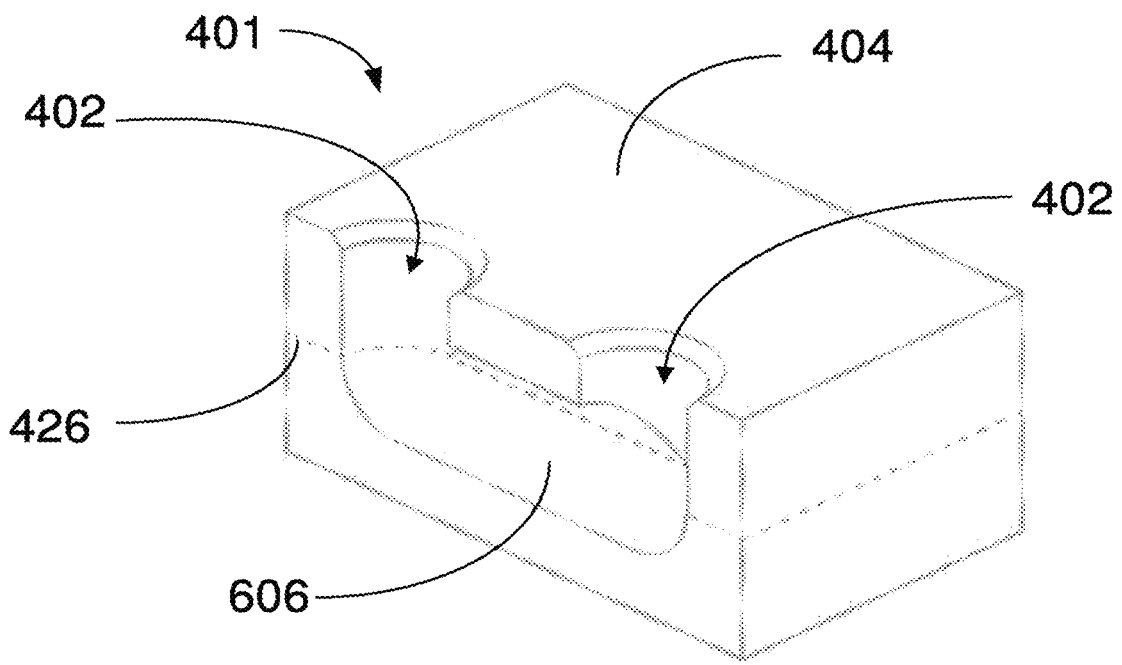
Figure 7:
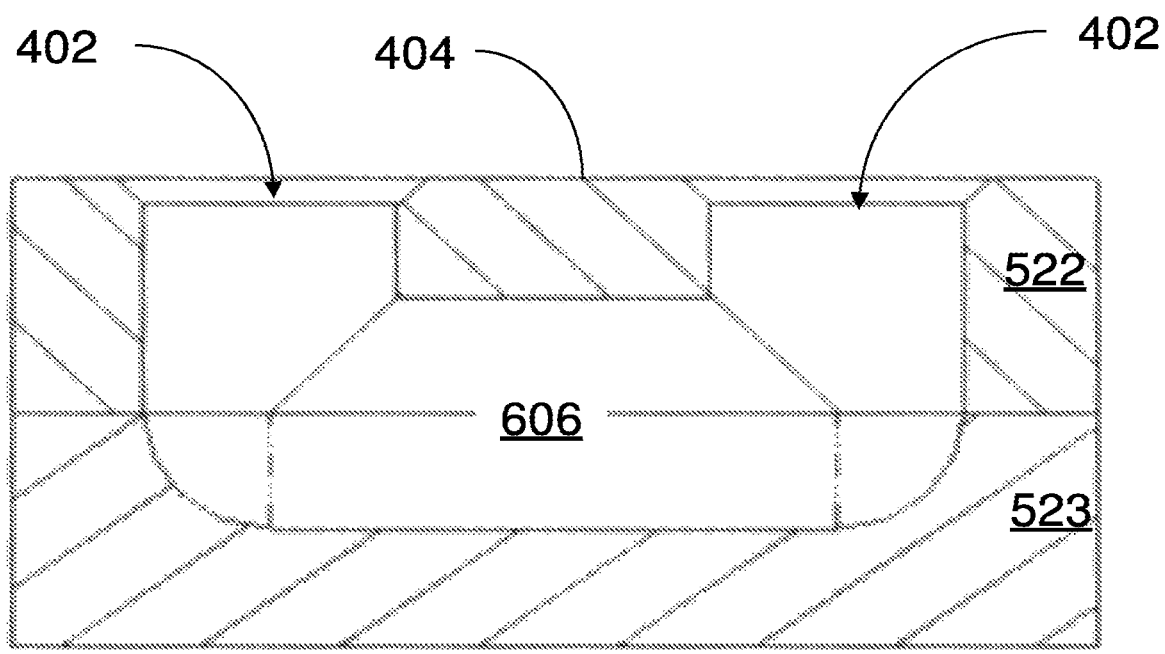
FIG. 7 shows a cross-sectional view of the substrate block of FIG. 4.

FIG. 4 shows a modular substrate block 401 according to embodiments of the present invention. In some embodiments, the substrate block of FIG. 4 can be manufactured by machining two separate layers of fluoropolymer and then joining the layers together via fusion bonding at seam 426. FIGS. 5A and 5B show an exploded view showing an upper layer 522 and a lower layer 523; FIGS. 6A and 6B show perspective views of a cross section of the substrate block of FIG. 4 along line A-A; and FIG. 7 shows a cross-sectional view of the substrate block of FIG. 4 along line A-A. The upper surface of lower layer 523 can be machined using known techniques to produce a smooth groove 528 at the desired location for the flow passageway. The bottom side of upper layer 522 can be machined to produce a corresponding groove (not shown). Entrance and exit ports 402 can also be drilled through upper layer 522 at each end of the flow passageway. When the two layers are placed together, the two corresponding grooves form the smooth flow passageway 606 seen in FIGS. 6A and 6B.

Once the two layers have been machined and properly positioned, the two layers can be bonded together using fusion bonding techniques by a combination of heat and pressure. The precise temperature/pressure/time combinations necessary for fusion bonding are known in the art and will vary with the particular fluoropolymer used to form the layers. In some embodiments, the two layers can be formed from modified PTFA and can be bonded together by heating the layers to a temperature of around 350° C. to 380° C. at a pressure of about 450 psi for at 1 hour (or longer). Under these conditions, the modified PTFE polymer chains within the two layers will become entangled causing the two surfaces to become permanently bonded at a molecular level and producing a solid homogeneous block of modified PTFE.

Although the substrate block of FIG. 4 has a very simple single flow passageway joining only two inlet/outlet ports, persons of skill in the art will recognize that these same techniques can be used to create much more complex flow passageways between any desired number of inlet/outlet ports. For example, FIGS. 8A and 8B show a substrate block with 4 different flow passageways 825 and 8 inlet/outlet ports 820. In some embodiments, more than two fluoropolymer layers can be used to create even more complex 3D flow paths. Substrate blocks can also be used as manifolds in with two or more inlet flow paths combine together with a single outlet flow path.

In other embodiments, a fluoropolymer block having the desired flow passageways and inlet/outlet ports can be created using known fluoropolymer molding techniques such as compression molding or isostatic molding. Some suitable fluoropolymers (such as PFA) are known to be melt-processable and can be molded using injection molding techniques. In other embodiments, a mold can be filled with PTFE or other fluoropolymer powder and then sintered under appropriate conditions to form two layers such as the ones shown in FIGS. 5A and 5B without any machining required to produce the one or more flow passageways. In similar fashion, a complete substrate block with one or more flow passageways can be directly produced by sintering the PTFE or other fluoropolymer powder.

Skilled persons will recognize that the use of some or all of these techniques, or any combination thereof, will also be within the scope of the invention.

Figure 9A:
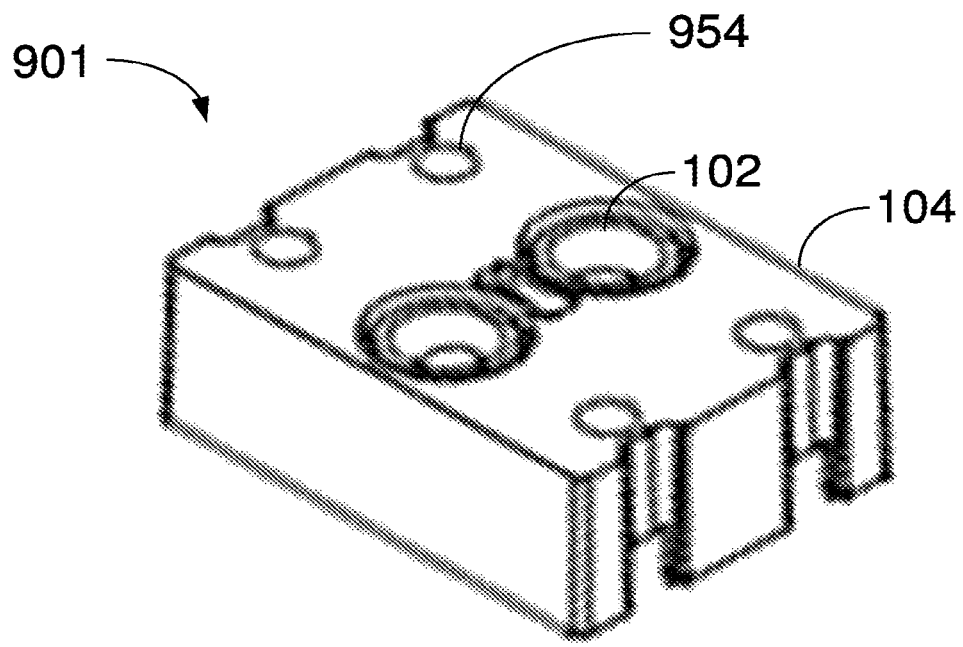
FIG. 9A shows a top (seal) side perspective view of another modular substrate block according to an embodiment.
Figure 9B:
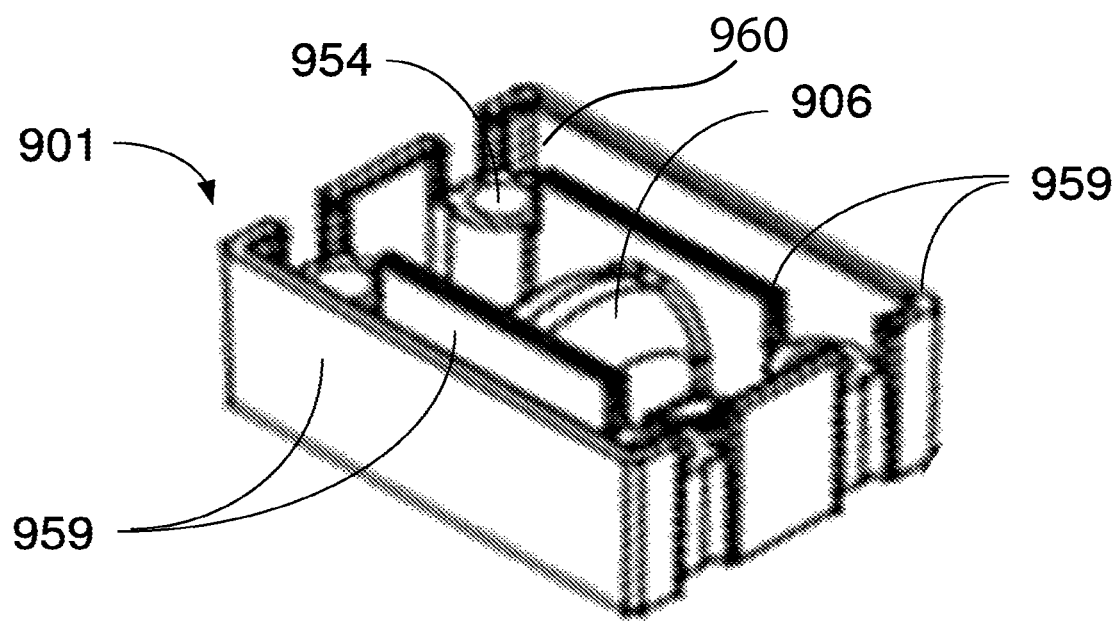
FIG. 9B shows a bottom side perspective view of the modular substrate block of FIG. 9A.
Figure 10A:
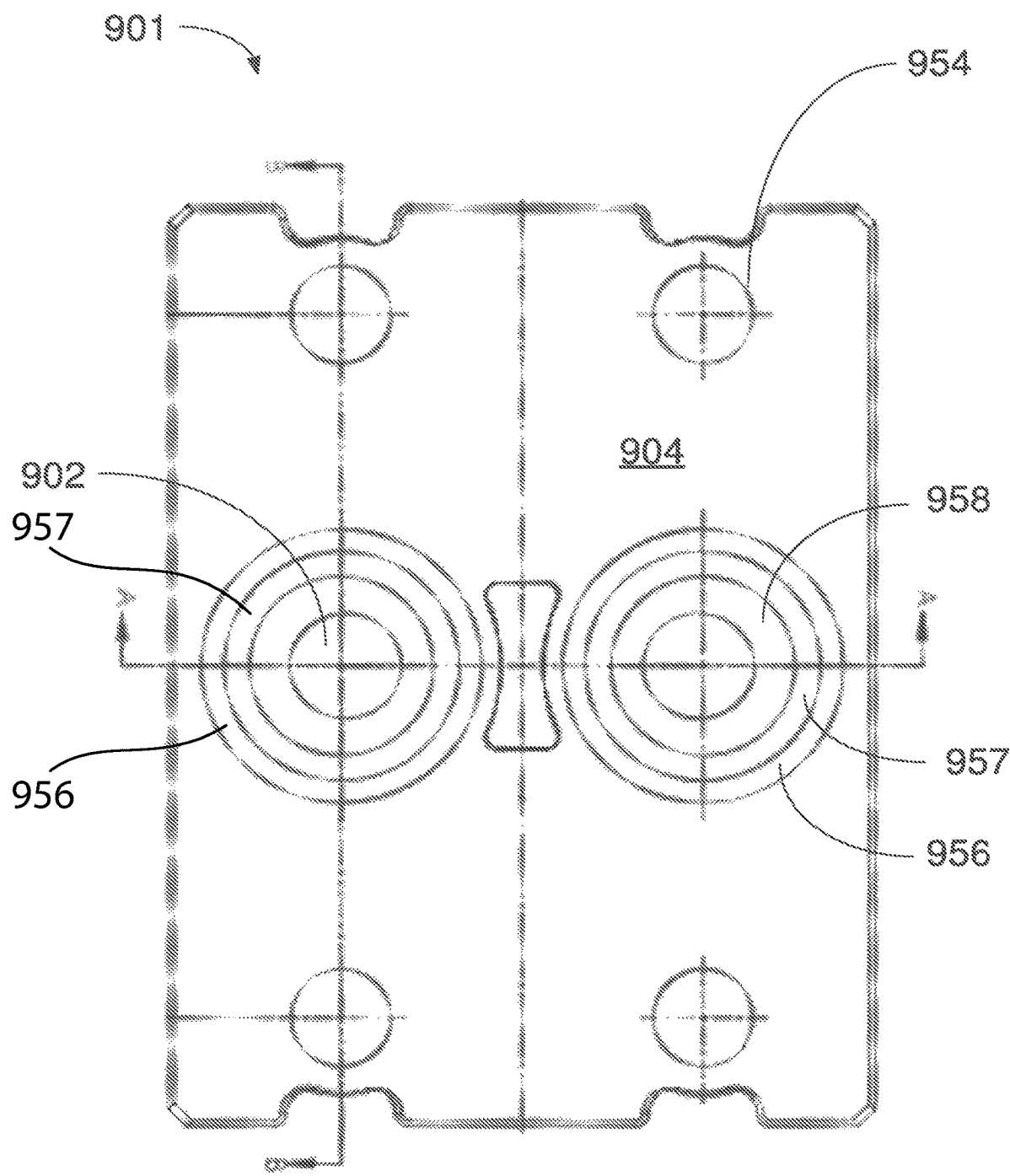
FIG. 10A shows a top down view of the modular substrate block of FIG. 9A.
Figure 10B:
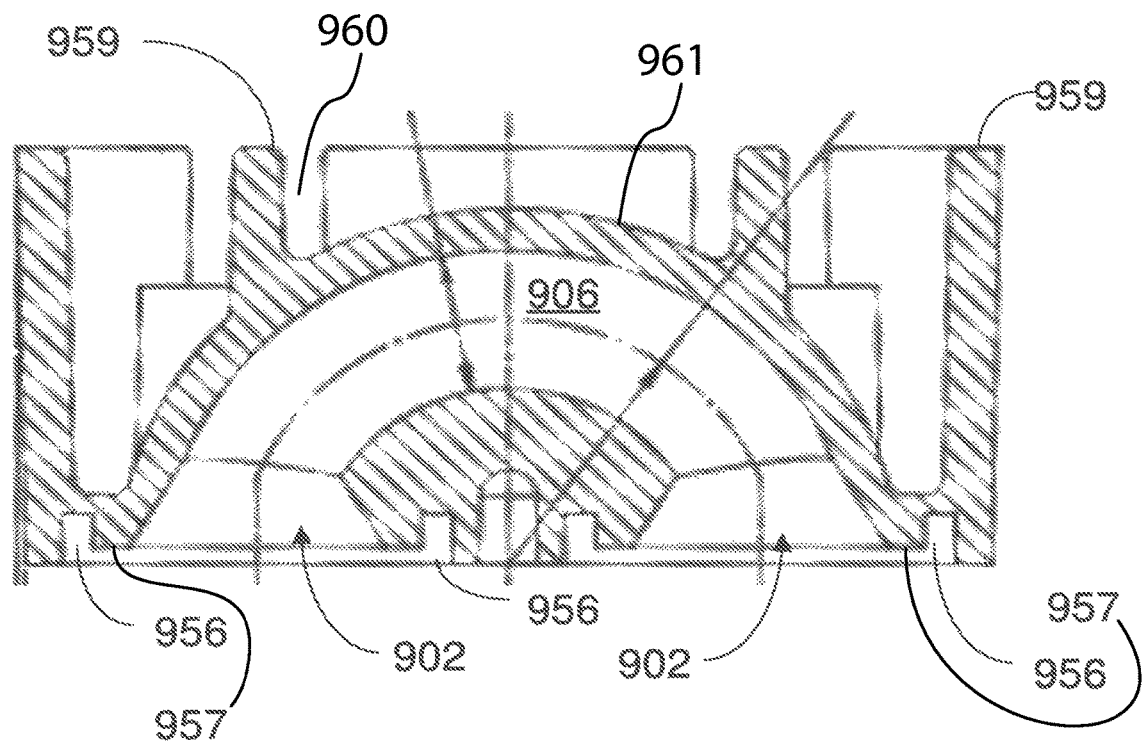
FIG. 10B shows a cross-section view of the modular substrate block of FIG. 9A along line AA.
Figure 10C:
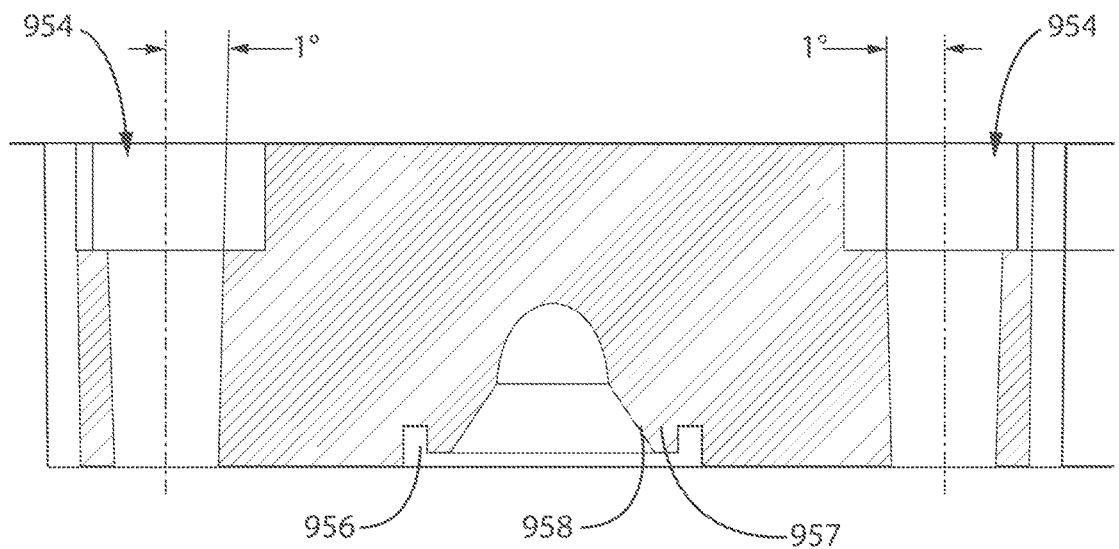
FIG. 10C shows a cross-section view of the modular substrate block of FIG. 9A along line BB.

FIGS. 9A and 9B show perspective views, from the top (seal) side and the bottom side respectively, of another modular substrate block 901 according to embodiments of the present invention. In some embodiments, the substrate block of FIGS. 9A and 9B can be manufactured by injection molding using a material such as PFA, although other suitable manufacturing methods and materials could also be used within the scope of the invention. FIG. 10A shows a top (seal) view of modular substrate block 901, while FIG. 10B shows a cross-section view along line AA and FIG. 10C shows a cross-section view along line BB.

In some embodiments, a multipart mold can be used to form the body of the modular substrate block, with a removable curved insert used to form the smooth fluid pathway 906. Regardless of the exact manufacturing method, embodiments of the modular substrate block contain one or more smooth and substantially seamless fluid pathways where the entire volume of the fluid pathway is directly in line with the desired fluid flow so that fluid flow completely sweeps the entire flow passageway and there are no dead volumes or areas of entrapment in said fluid passageway. In the embodiment of FIG. 10B, the fluid flow path forms a smooth arc with no corners or angular walls, which serves to largely eliminate dead volumes or areas of liquid entrapment.

The body of the modular substrate block can be formed as a substantially solid block of material except for the fluid pathway(s) and screw holes 954, as in the examples discussed above. The screw holes 954 may also be referred to as fastener holes 954 and may be tapered as illustrated in FIG. 10C. In other embodiments, the body of the modular substrate block can be formed only with the necessary support walls 959 as shown in the example of FIGS. 9A to 11C. Some or all of the support walls 959 and a floor surface 961 may define a cavity 960. Such an embodiment is particularly advantageous for injection molding because all the different sections in the body have substantially the same thickness, which makes it easier to fill all sections of the mold evenly to avoid unwanted voids. Such an embodiment, as shown in FIG. 9B, has a greater surface area as compared to the solid structure of FIG. 4, which may allow the modular substrate block to withstand higher temperatures.

In some embodiments, after substrate blocks containing the desired flow paths have been formed, an abrasive material can be flushed through the substrate blocks to remove a pronounced seams or molding artifacts and to ensure that the flow passageways are smooth. Alternatively, a specially designed tool could be used to smooth interior flow paths, either manually or automatically.

Referring again to FIGS. 2-3, substrate blocks according to the present invention can be combined together to form a weldless and tubeless flow pathway connecting a liquid source to a process via virtually any desired arrangement of active components (e.g., valves, pressure transducers, flow controllers, etc.). Liquid flows through passageways within the substrate blocks themselves rather than through separate tubing. The present invention thus provides a solution to the problems of the prior art by providing a plurality of individual substrate blocks with each substrate block having at least one fluid passageway with an entrance and exit port accessing a common surface. The common surface can be used to mount standard active components such as flow controllers, pressure transducers, flow measurement sensors, pressure regulators, valves, etc. In some embodiments, the common surface for each of the respective adjacent manifold blocks being maintained in a common plane to facilitate sealing requirements. The active components will bridge or extend across adjacent substrate blocks with the substrate blocks being removably aligned and mounted (as described above) to operatively permit the respective fluid passageways to be positioned for a sealed interconnection.

Applicants have found that the use of these types of modular components, which is made possible by the novel systems and processes described herein, can result in a liquid chemical delivery system with a footprint that is less than ½ the size of a typical prior art liquid chemical delivery system. Unlike traditional liquid delivery systems where components are connected via fitting and tubing, in embodiments of the present system, components can be positioned with very little gap between components. In preferred embodiments, adjacent components can be positioned with a gap of less than 20 mm, such as less than 10 mm, less than 5 mm, approximately 1 mm, or even less than 1 mm. In some embodiments, the use of standardized widths for active components (for example, 55 mm) also allows the various components to be positioned with no wasted space between parallel liquid flow lines. In preferred embodiments, the ratio of wasted space to total system footprint can be as low as 30%, such as the ratio can be as low as 20%, as low as 10%, or even as low as 5%. The use of such modular components also serves to largely eliminate the design time and expense associated with custom parts and/or tube assemblies.

Figure 11A:
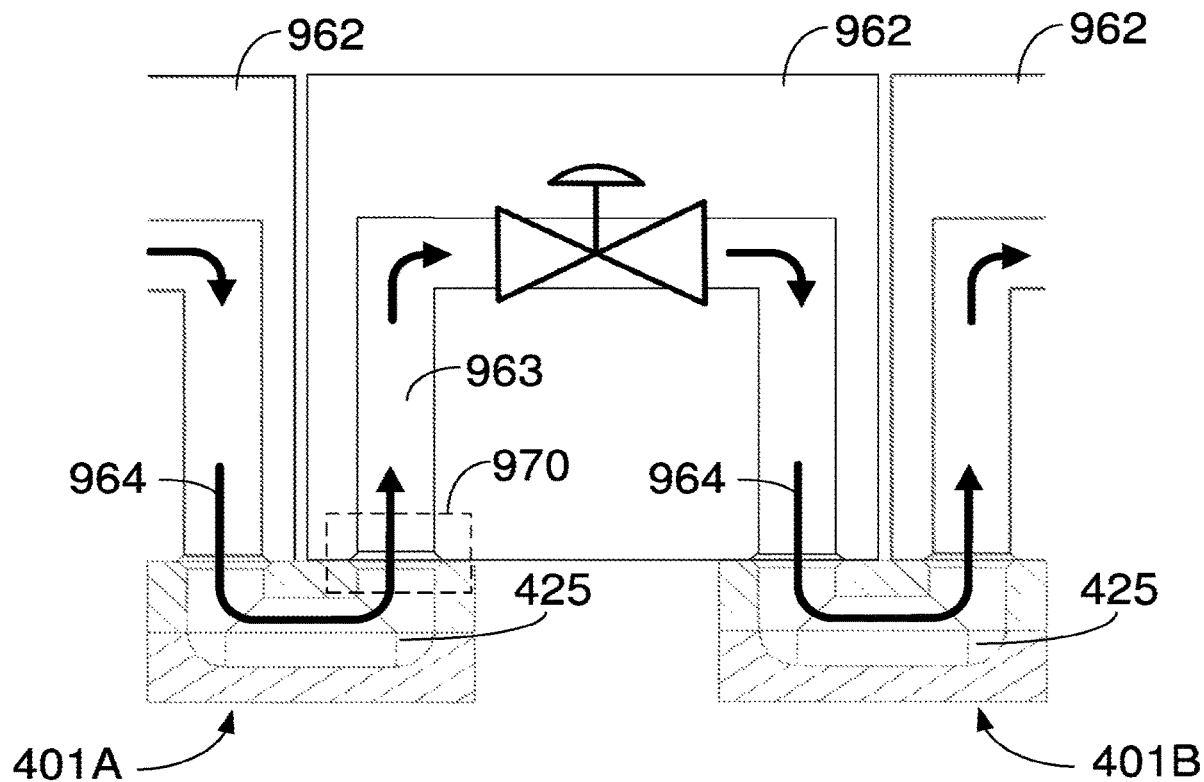
FIG. 11A illustrates the fluid flow path through substrate blocks and an active component according to an embodiment.

As described above, in some embodiments of the invention active components are mounted onto substrate blocks via screws or other fasteners. Screw holes 854 are positioned on either side of each inlet/outlet port. In some embodiments metal inserts are placed inside screw holes 854 to provide metal threads and facilitate a tight connection. The underside of each active component thus has a corresponding inlet/outlet port that is held in position over the inlet/outlet port of the substrate block. In preferred embodiments, the housing for active component 962 is also formed from a polymer or fluoropolymer. FIG. 11A illustrates the fluid flow path (shown by arrows 1164) in one embodiment. Active component 1162 (in this example a valve) is mounted over an outlet port of a first substrate block 401 A so that the fluid path inside active component 1162 is fluidly connected to the fluid path within substrate block 401A. Likewise, active component 1162 is also mounted to substrate block 401B so that the outlet port of active component 1162 is positioned over the inlet port of substrate block 401B and the fluid path out of active component 962 is fluidly connected to the fluid passageway within substrate block 401B.

Figure 11B:
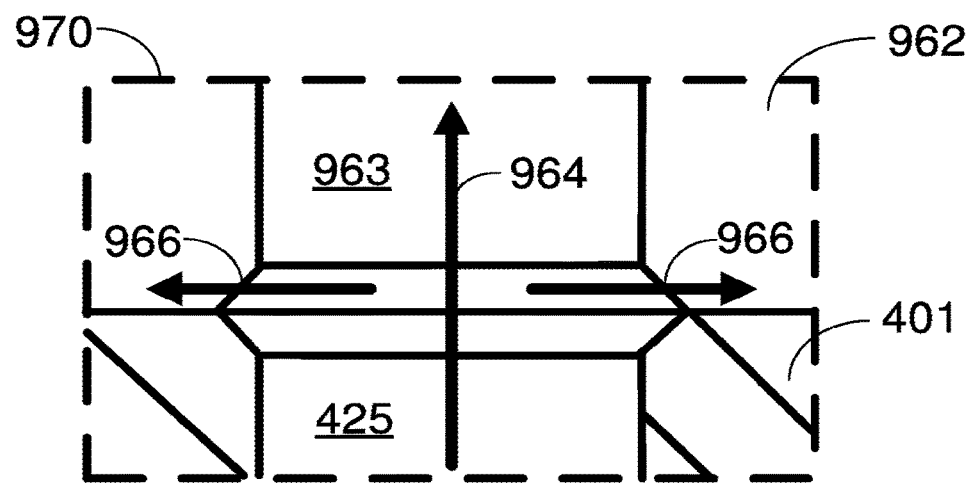
FIG. 11B is an enlarged view of the portion of FIG. 11A.

FIG. 11B is an enlarged view of the portion of FIG. 11A inside dashed box 1170. As shown in FIG. 11B, the desired fluid path (line 1164) leads from substrate block 401A, through the inlet/outlet ports on the top surface of substrate block 401A and the underside of active component 1162, and into the component fluid passageway 1163. Even with a tight connection between the component and substrate block, leakage (in the direction shown by arrows 1166) is still a possibility. A face-to-face interface also has a potential for entrapping liquid which can lead to microbial proliferation or releases of large particle counts. Accordingly, in some embodiments one or more sealing assemblies are used to prevent any leakage at the connections between active components and substrate blocks.

Some embodiments of the present invention make use of tongue and groove structures and/or inserts to provide a seal between active components and substrate blocks. In some embodiments, similar seals could be used to form a fluid connection directly between substrate blocks or between active components. As shown in FIGS. 10B and 10C, tongue and groove (957 and 956 respectively, the tongue 957 also referred to as a substrate ring 957 and the groove 956 also referred to as a substrate channel 956) are formed directly into the bodies of the two components (i.e., a small protruding "tongue" on one surface fits into a "groove" formed into the corresponding surface.). A conical portion 958 is formed concentric with the substrate ring 957, the conical portion 958 joining the substrate fluid passageway 906. Inserts are separately formed and replaceable sealing components that can be placed into channels formed in one or both connecting surfaces.

Figure 12A:
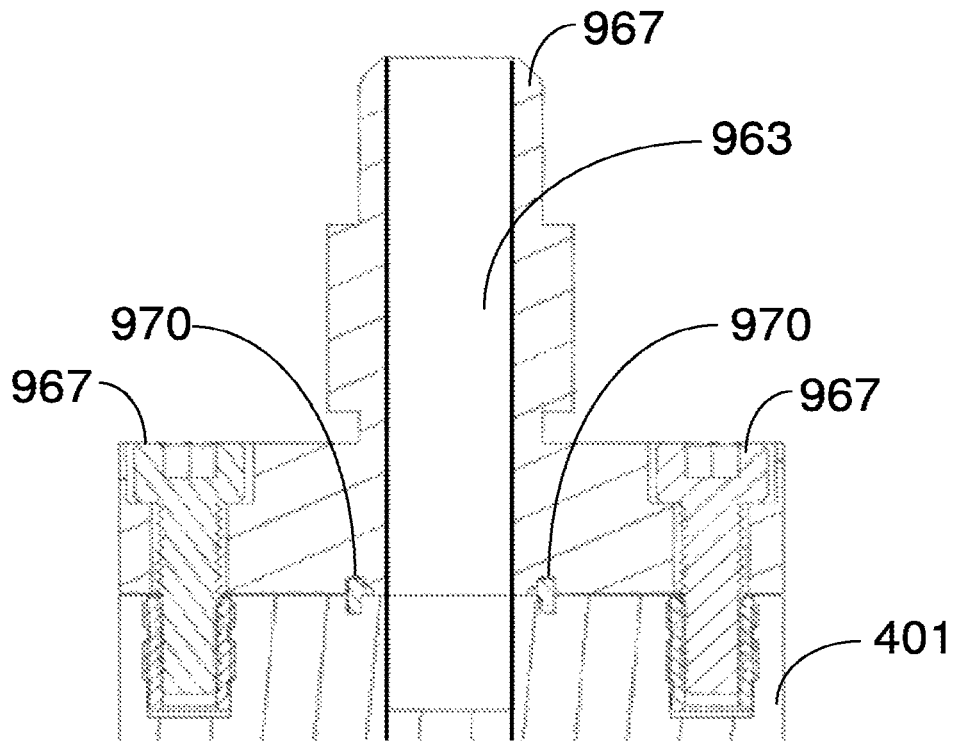
FIGS. 12A and 12B show a replaceable insert seal according to an embodiment.
Figure 12B:
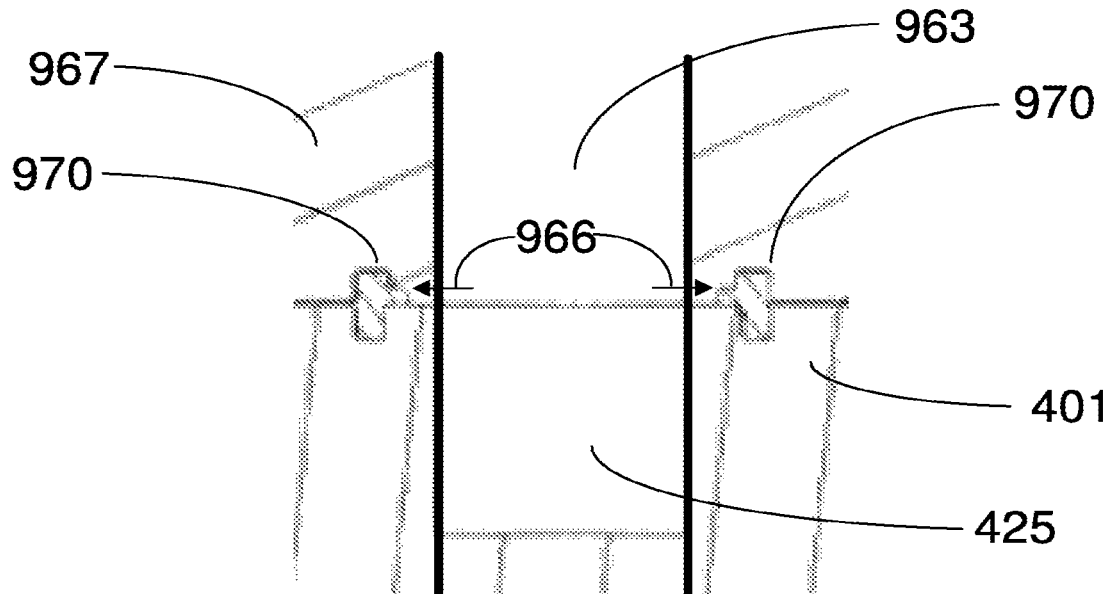
Figure 13A:
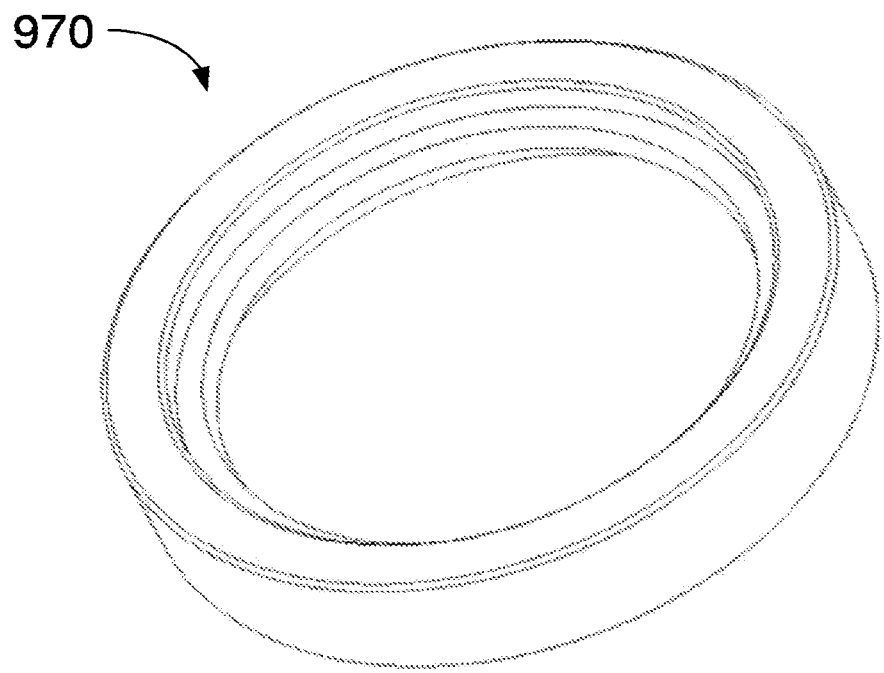
FIG. 13A shows a replaceable insert seal according to an embodiment.
Figure 13B:
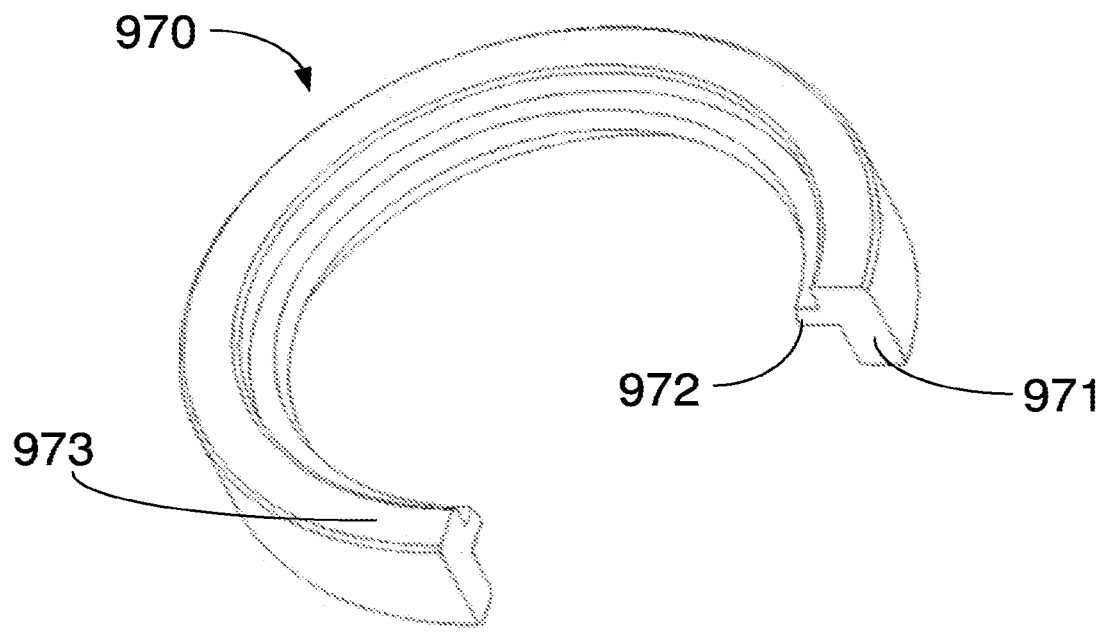
FIG. 13B shows a cut-away of the seal of FIG. 13A.
Figure 14A:
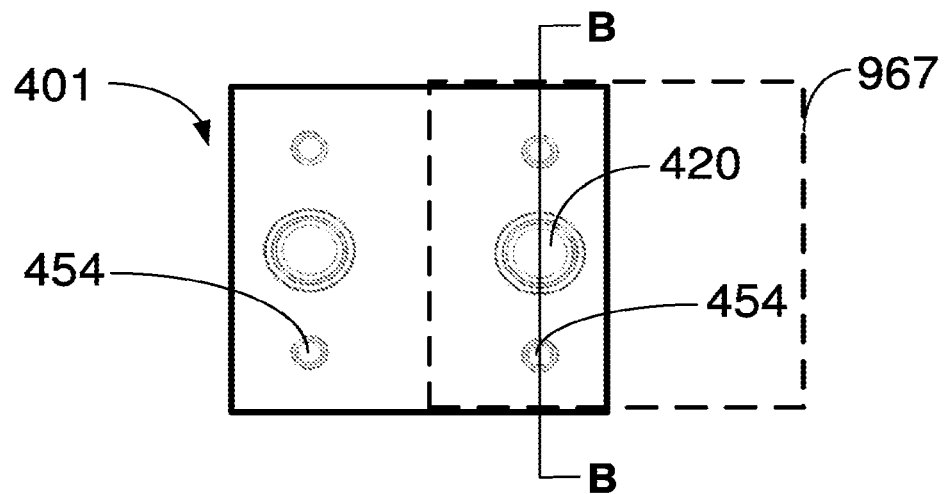
FIG. 14A shows a substrate block according to an embodiment.

FIGS. 12A and 12B show one embodiment of the invention in which a replaceable insert seal 970 can be placed inside a shaped channel surrounding the fluid connection between a substrate block 401 and an active component 1162. In the cross-section views of FIGS. 12A and 12B, the active component shown is a test fixture used to test flow and extractable particle requirements, but the seal arrangement would be the same for an actual active component such as a valve or liquid flow meter, etc. FIG. 14A shows a substrate block 401 with line B-B illustrating the location of the cross-section of FIGS. 12A and 12B. FIG. 13A shows a perspective view of seal 970, while FIG. 13B shows a cut-away of seal 970 to illustrate the cross-section shape. In the embodiment shown, the chamfered horizontal section 972 of seal 970 aids in correct installation of the seal by providing a leading edge that can be easily inserted into the channel on one of the mounting surfaces (in the underside of the active component in this embodiment). Referring again to FIGS. 8A and 8B, seal channels 860 are machined or otherwise formed around each inlet/outlet port 820.

In preferred embodiments, seal 970 can also be made from a polymer or fluoropolymer. Applicants have discovered that, due to the increased tolerances required for structures machined or otherwise formed in polymer bodies, that the seal ring 970 should be sized so that there will always be interference on the leading edge 972 of the seal ring. In other words, the seal ring will be horizontally compressed during installation to ensure that a liquid seal is always formed. In contrast, in some embodiment, the seal will be sized so that there is little or no vertical interference or compression on the horizontal portion 971 of the ring.

Figure 14B:
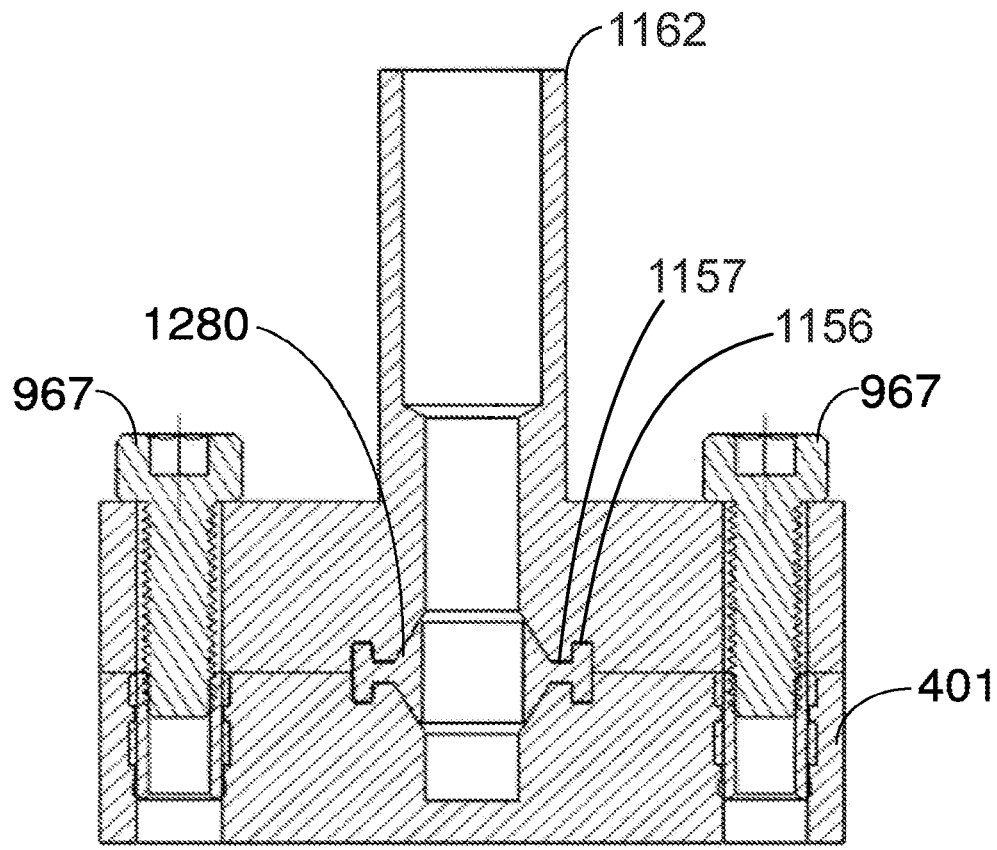
FIG. 14B shows another embodiment of a replaceable insert seal.

FIG. 14B shows another embodiment of a replaceable seal ring 1280 in a cross-sectional view of an active component 1162 mounted onto a substrate block 401. Again, FIG. 14A shows a substrate block 401 with line B-B illustrating the location of the cross-section of FIG. 14B. The active component 1162 has component rings 1157 surrounded by component channels 1156.

Figure 15A:
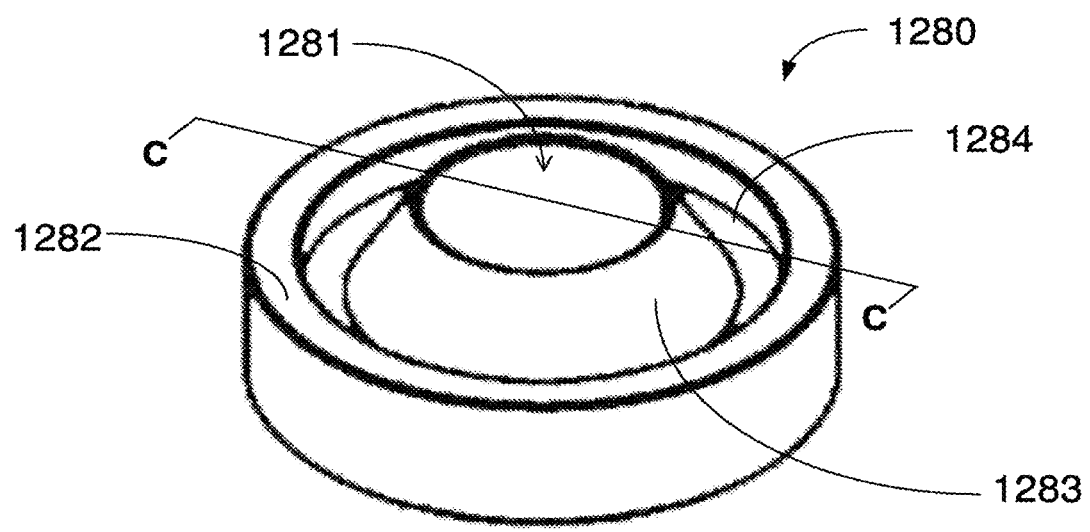
FIG. 15A shows the replaceable insert seal of FIG. 14B.
Figure 15B:
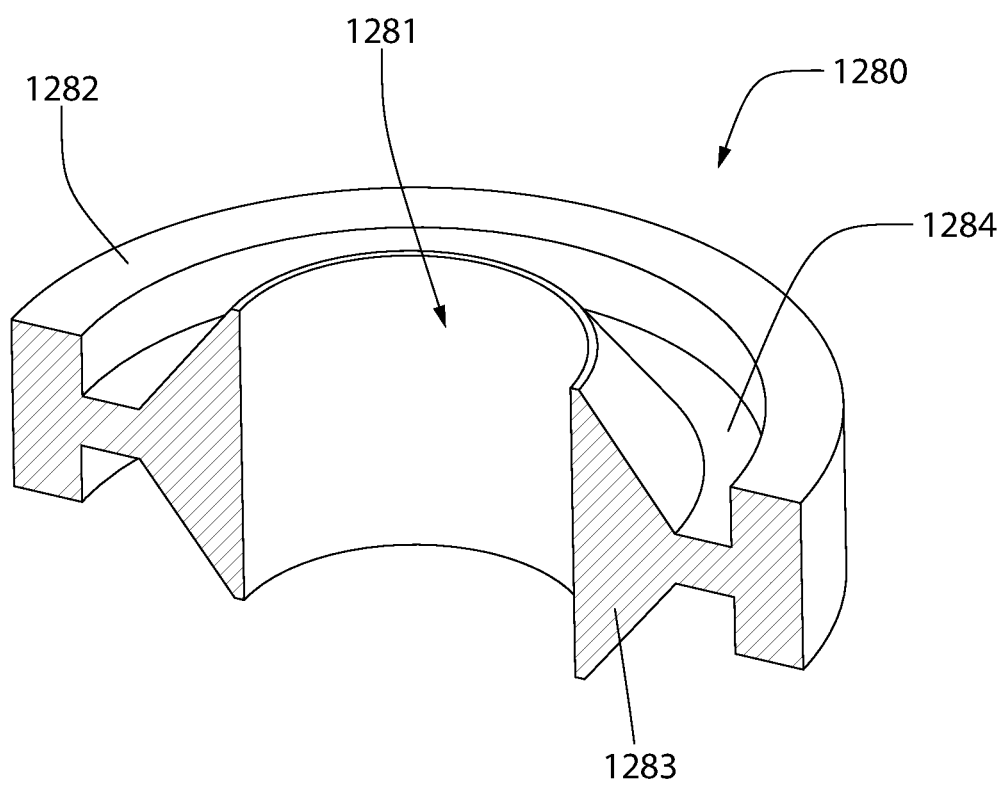
FIG. 15B shows a cut-away view of the replaceable insert seal of FIG. 14B.

FIG. 15A shows a perspective view of 1280, while FIG. 15B shows a cutaway of seal 1280 to illustrate the cross-section shape. Seal ring 1280 features an interior conical sleeve 1283 with no horizontal portion (which can potentially allow leakage). Liquid thus sweeps through the interior of sleeve 1283 when the seal is in place. The outer ring 1282, connected to the conical sleeve section via horizontal bridge section 1284, provides an additional seal behind the conical seal section 1283 to act as a backup and to add in positioning. The tapered shape of the conical center section 1283 also serves to aid in installation of seal ring 1280. As with the seal ring embodiment described above, seal ring 1280 is sized so that, when installed, the channels cause horizontal interference but not vertical interference.

Figure 16A:
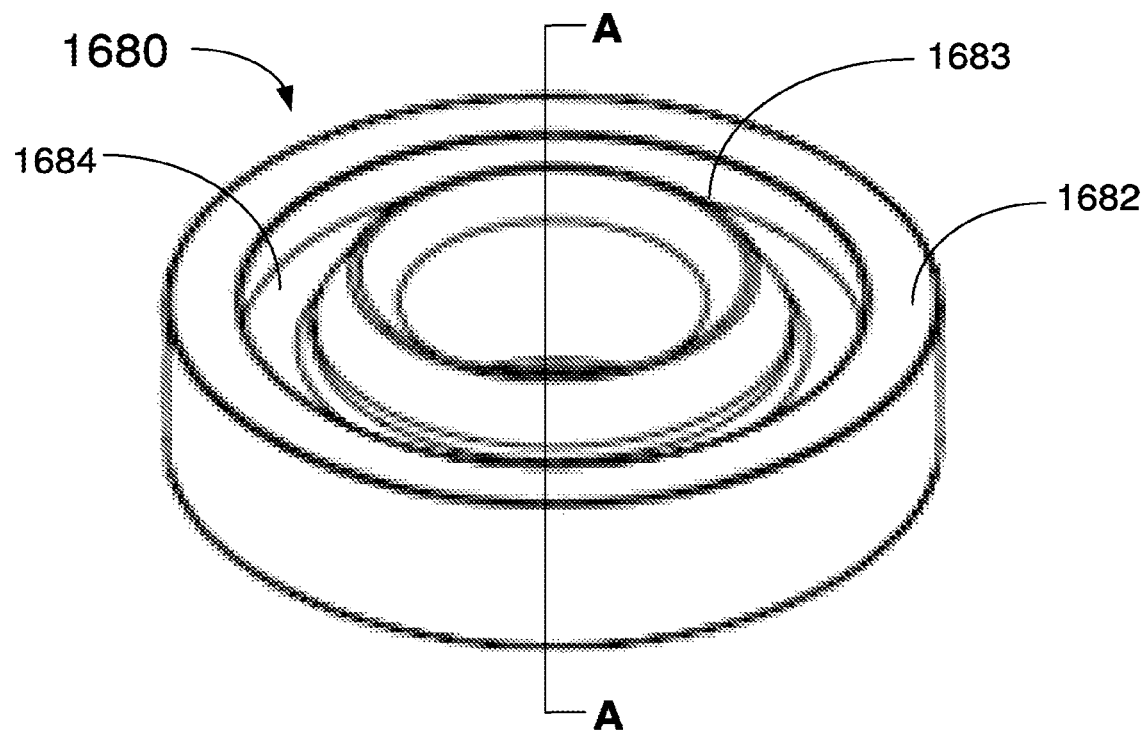
FIG. 16A shows a perspective view of another replaceable insert seal according to an embodiment.
Figure 16B:
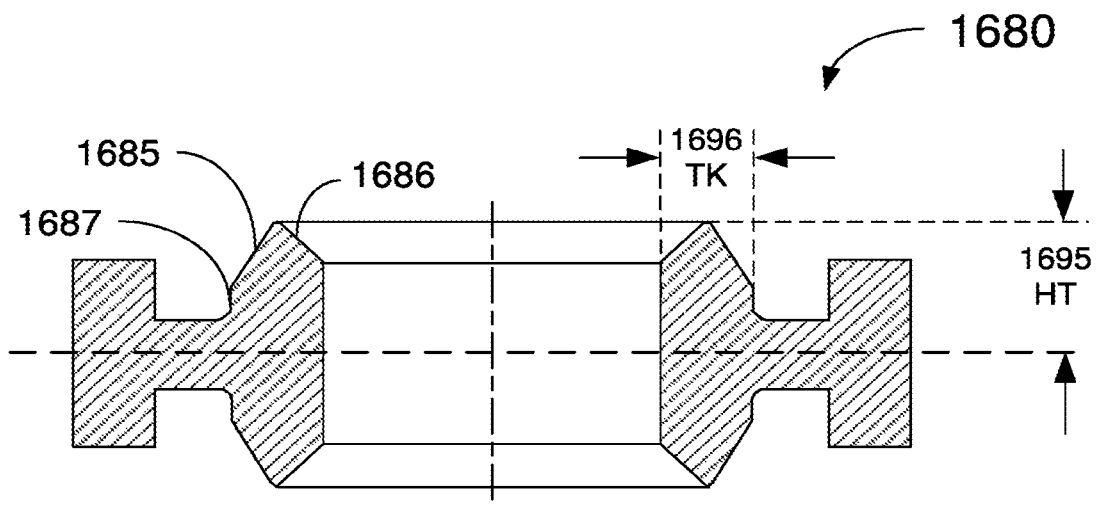
FIG. 16B is a cross section of the seal of FIG. 16A along line AA.
Figure 16C:
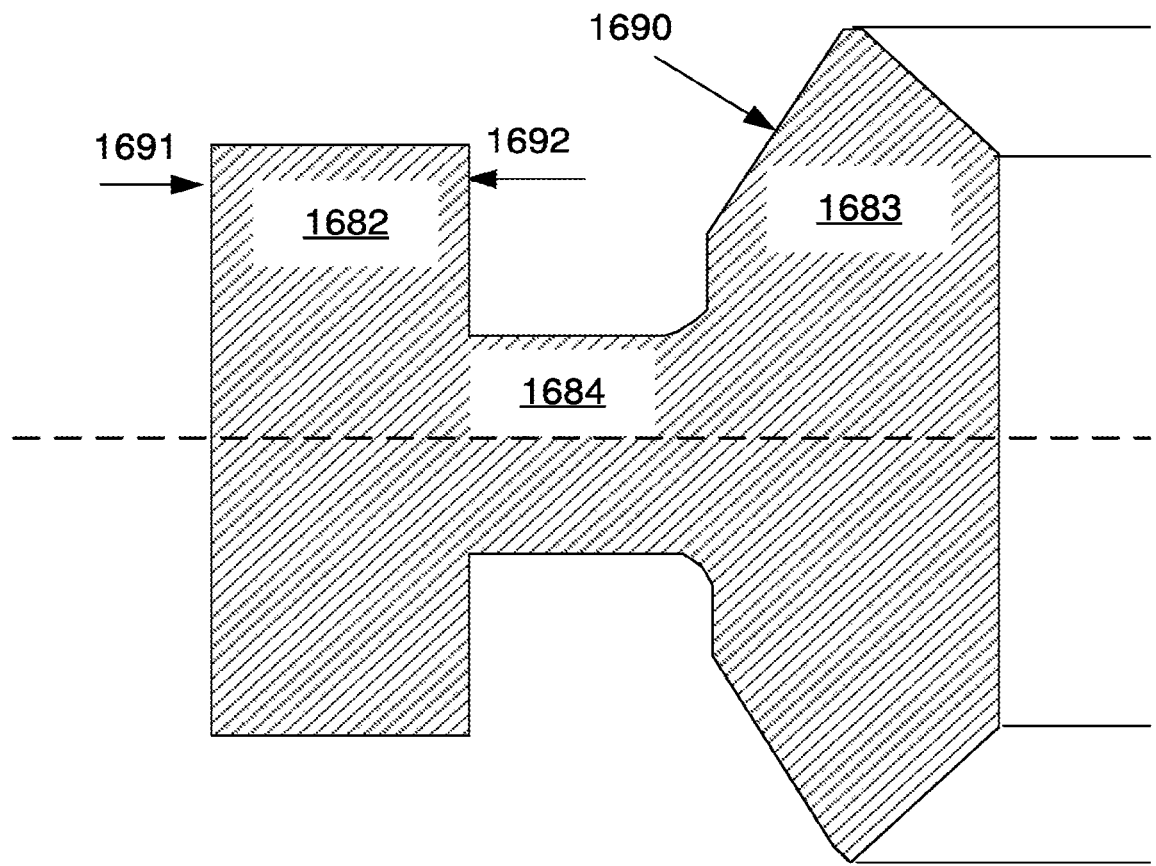
FIG. 16C is a close-up view of the cross section of FIG. 16B.

FIG. 16A shows a perspective view of another embodiment of a replaceable seal ring 1680 used to provide a liquid seal at the inlet and outlet ports of modular substrate blocks according to embodiments of the invention. FIG. 16B is a cross section of the seal of FIG. 16A along line AA. FIG. 16C is a close-up view of one half of the cross section of FIG. 16B. Seal ring 1680 features an interior conical sleeve 1683. Conical sleeve 1683 has an outwardly sloped portion 1685 (sloped away from the port opening), and inwardly sloped portion 1686 (sloped toward the port opening), and an outer vertical portion 1687. In the embodiment of FIG. 16A, the conical sleeve portion of the seal has no horizontal surface (which can potentially allow leakage). In some embodiments, the slope of the outwardly sloped portion 1685 is at an angle of about 25 to 35 degrees, such as about 30 degrees, relative to the vertical axis (or the inner wall of the seal). In some embodiments, the slope of the inwardly sloped portion 1686 is at a greater angle relative to the vertical axis than the slope of the outwardly sloped portion, such as an angle of 40 to 50 degrees, such as an angle of about 45 degrees.

In some embodiments of a seal featuring an interior conical sleeve, the ratio of the height of the cone (indicated by arrows and reference number 1695) to the thickness of the cone wall (indicated by arrows and reference number 1976) will be in the range from about 0.5 to 2.5, such as about 1.0 to 2.0, 1.1 to 1.8, or 1.1 to 1.6.

In some embodiments, the seal is sized so that the outwardly sloped portion 1685 of the conical sleeve is compressed when the seal is installed, as indicated by arrow 1690. The seal is also sized so that the upper edge of the port opening (substrate mating part) will not be in contact with the outwardly sloped portion 1685 when the seal is installed. Instead, the edge of the port opening will slide past outer vertical portion 1687 with the seal in the area indicated by reference number 1688. The tapered shape of the conical center section 1683 also serves to aid in installation of seal ring 1680. Liquid thus sweeps through the interior of sleeve 1683 when the seal is in place.

The outer ring 1682 provides an additional seal behind the conical seal section 1683 to act as a backup and to serve as an additional add in positioning. In some embodiments, seal ring 1680 is sized so that, when installed, the channels surrounding the port openings in the modular substrate blocks cause horizontal interference on the outer and inner surfaces of outer ring 1688 as indicated by arrows 1691 and 1692. In some embodiments, there is no vertical interference on the top or bottom sides of the ring, on horizontal bridge section or web 1684, and/or upon the conical center section 1683.

In some embodiments, tongue and groove inserts can be employed in addition to the removable inserts described above, both as a backup or secondary seal and as an additional aide in properly aligning the ports on active components and substrate blocks.

Figure 17A:
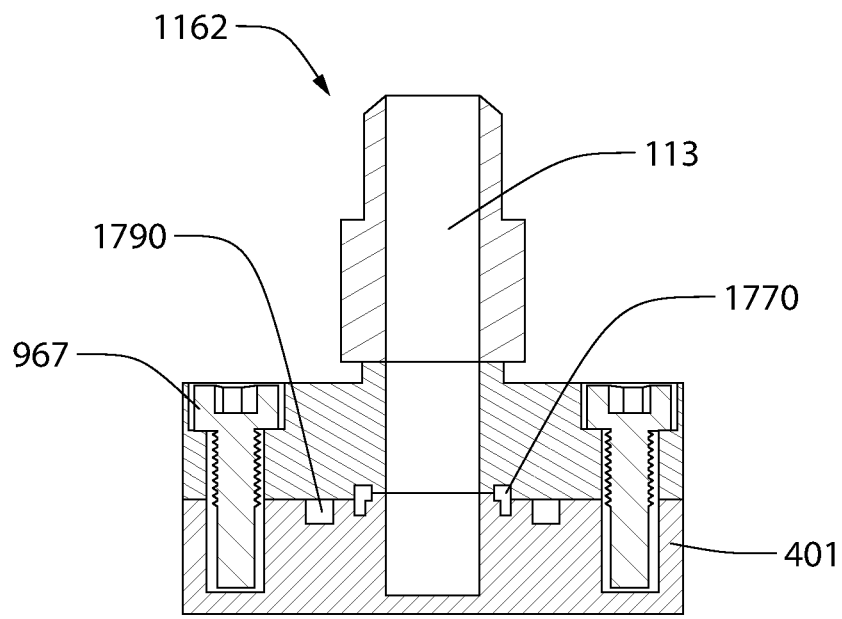
FIGS. 17A-17D show a variety of possible tongue and groove structures that could be used as either secondary or primary seal structures according to embodiments of the invention.
Figure 17B:
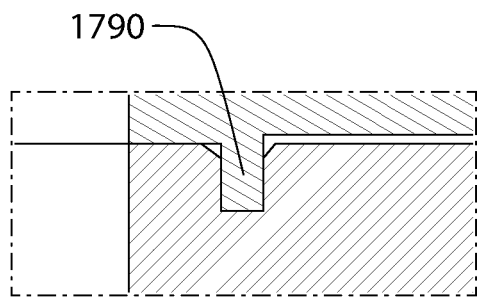
Figure 17C:
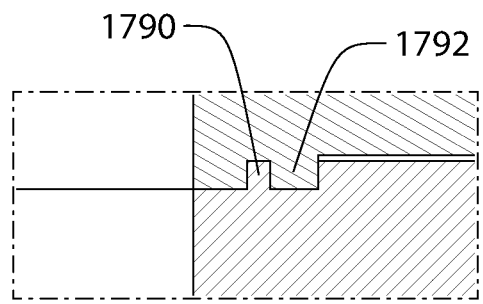
Figure 17D:
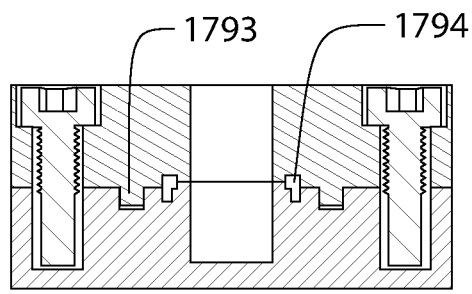

FIG. 17A illustrates the position of the tongue and groove secondary seal 1790 in relation to the primary seal insert 1770 according to an embodiment of the invention. In other embodiments, the tongue and groove structure could be the primary seal structure (closest to the desired flow path) and a seal insert could be the secondary seal. FIGS. 17B-17D show a variety of possible tongue and groove structures that could be used as either secondary or primary seal structures. FIG. 17B shows simple corresponding tongue and groove rings 1790. FIG. 17C shows the addition of a reversed concentric shoulder 1792 that acts to protect the tongue ring of FIG. 17B from damage. And FIG. 17D shows a double set of concentric tongue and groove rings (1793, 1794). In some embodiments, a leak detector can be embedded in the substrate between the primary and secondary seals.

Figure 18:
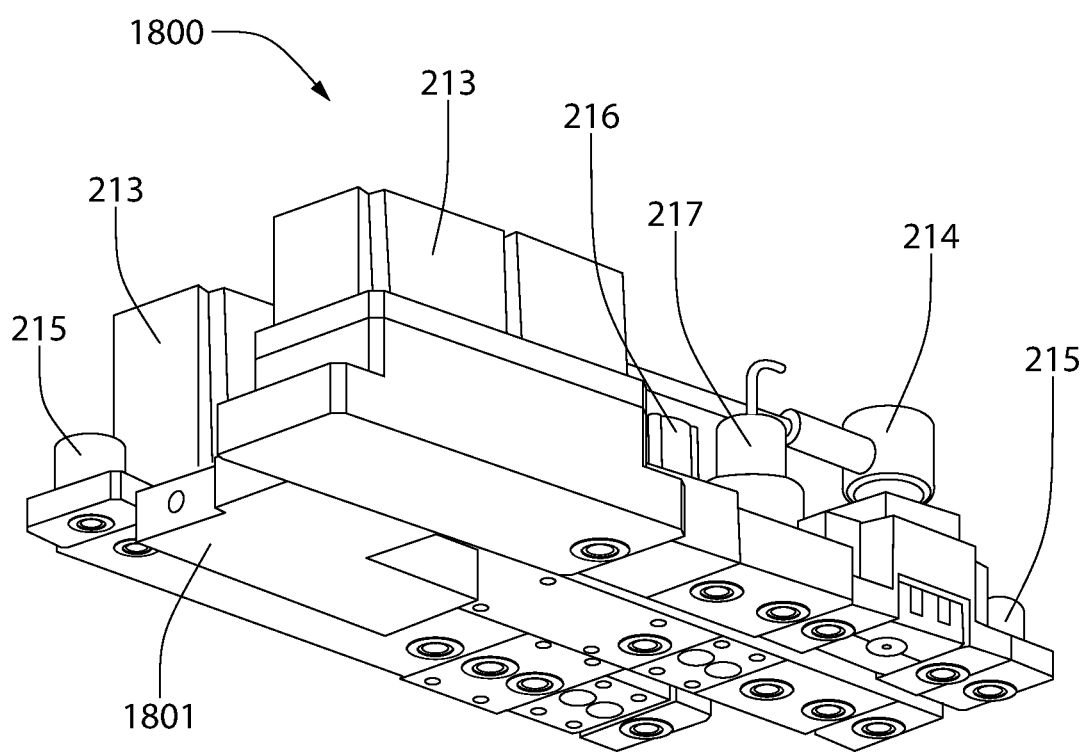
FIG. 18 shows another embodiment of a liquid chemical delivery system according to an embodiment of the invention.
Figure 19:
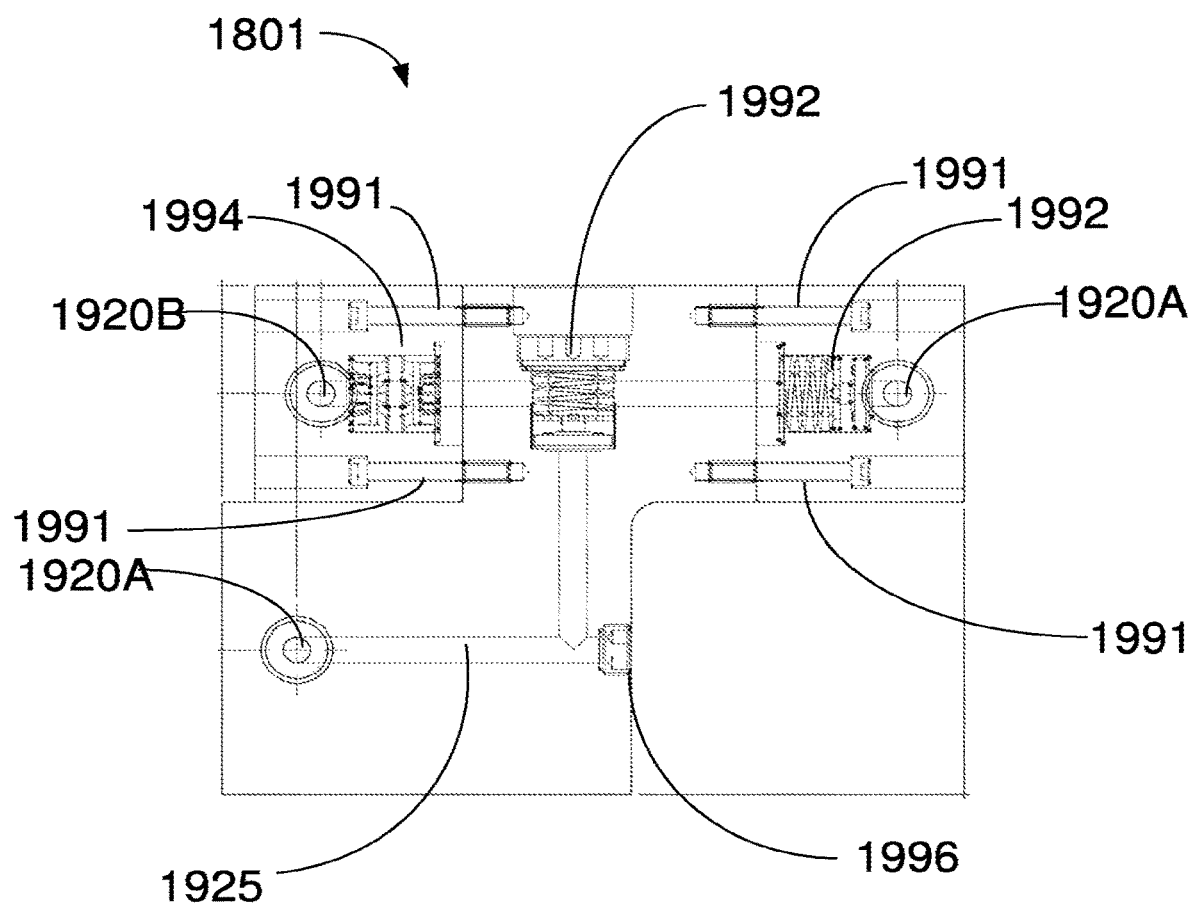
FIG. 19 shows a transparent view of substrate block having embedded active components according to an embodiment.

FIG. 18 shows another embodiment of a liquid chemical delivery system 1800 in which substrate block 1801 has one or more active components embedded in the substrate block. FIG. 19 shows a transparent view of substrate block 1801 showing the interior structures. In the embodiment of FIG. 19, liquid enters the substrate block through inlets 1920A and proceeds throw flow path 1925 to check valves 1992 to static mixer 1994. The two fluid streams are thus combined and exit the substrate block through outlet port 1920B. A substrate block 1401 can be formed from a polymer or fluoropolymer as described above for use with liquid chemicals. In some embodiments, substrate block 1401 can be formed from a metal such as stainless steel for use with gas mixtures. Substrate block 1401 can either be formed with the slots for active components or the slots/openings can be machined into the substrate block. Flow paths can be formed as described above, or machined using prior art methods. In some embodiments, embedded active components are replaceable and removably held in place by screws/fasteners 1991.

Many different aspects and embodiments are possible. Some of those aspects and embodiments are described herein. After reading this specification, skilled artisans will appreciate that those aspects and embodiments are only illustrative and do not limit the scope of the present invention. Embodiments may be in accordance with any one or more of the items as listed below:

Item 1. A liquid deliver system comprising: a substrate block including a first substrate port and a second substrate port formed in a first surface and a first liquid passageway that extends in a first direction and fluidly connects the first substrate port to the second substrate port; a first active component fluidly connected to the first substrate port and a second active component, which is distinct from the first active component, fluidly connected to the second substrate port; and wherein the first liquid passageway has no dead volume or areas for liquid entrapment.

Item 2. A system for enabling a distribution of liquid chemicals, comprising: a substrate block including a first substrate port and a second substrate port formed in a first surface and a first liquid passageway that extends in a first direction and fluidly connects the first substrate port to the second substrate port; wherein the first substrate port is adapted to be fluidly connected to a first active component and the second substrate port is adapted to be fluidly connected to a second active component that is distinct from the first active component; and wherein the first liquid passageway is a smooth passageway having no dead volume or areas for entrapment of liquid.

Item 3. A system for enabling a distribution of liquid chemicals, comprising: a substrate block including a first substrate port and a second substrate port formed in a first surface and a first liquid passageway that extends in a first direction and fluidly connects the first substrate port to the second substrate port; wherein the first substrate port is adapted to be fluidly connected to a first active component and the second substrate port is adapted to be fluidly connected to a second active component that is distinct from the first active component; and wherein the entire volume of the first liquid passageway is in line with the fluid flow.

Item 4. Any one of the preceding items wherein the first liquid passageway is formed so that liquid flow sweeps through the entire volume of the liquid passageway.

Item 5. Any one of the preceding items wherein the entire volume of the first liquid passageway is in line with the fluid flow.

Item 6. Any one of the preceding items in which the substrate block comprises a polymer or fluoropolymer.

Item 7. Any one of the preceding items in which the substrate block comprises polypropylene, PTFE, modified PTFE, or PFA.

Item 8. Any one of the preceding items in which the substrate block comprises a third and a fourth substrate port formed in the first surface and a second liquid passageway fluidly connecting the third substrate port to the fourth substrate port.

Item 9. Any one of the preceding items in which the substrate block is formed by machining a smooth groove in an upper surface of a first substrate layer and a matching smooth groove in a bottom surface of a second substrate layer, positioning the second substrate layer on the first substrate layer so that the matching grooves form a liquid passageway and bonding the two layers together.

Item 10. Item 9 further comprising drilling a first port and a second port through the second layer at either end of the formed groove.

Item 11. Any one of the preceding items in which bonding the two substrate layers comprises fusion bonding two polymer or fluoropolymer layers together by the application of heat and pressure.

Item 12. Any one of the preceding items in which the substrate block is formed by molding a polymer or fluoropolymer.

Item 13. Item 12 in which molding comprises compression molding, isostatic molding, melt-processing, or injection molding.

Item 14. Any one of the preceding items in which the substrate block is formed by sintering a fluoropolymer in a mold.

Item 15. Any one of the preceding items in which the substrate block is formed by sintering two separate substrate layers in molds and then fusion bonding the layers together.

Item 16. Any one of the preceding items in which the active components comprise one or more components selected from the group of flow controllers, pressure transducers, flow measurement sensors, pressure regulators, and valves.

Item 17. Any one of the preceding items in which the liquid delivery system has a footprint having a ratio of free space to system components that is no more than 30%, no more than 20%, no more than 10%, or no more than 5% free space.

Item 18. Any one of the preceding items in which the liquid delivery system has a plurality of active components mounted so that the space between active components is less than 20 mm, such as less than 10 mm, less than 5 mm, approximately 1 mm, or even less than 1 mm.

Item 19. A liquid delivery system comprising: a substrate block including a first substrate port and a second substrate port formed in a first surface and a first liquid passageway that extends in a first direction and fluidly connects the first substrate port to the second substrate port; a first active component having a lower surface fluidly connected to the first substrate port; and a seal assembly sealing the fluid connection, the seal assembly including a primary seal comprising a removable seal insert, and a secondary seal comprising a tongue and groove structure formed in the first surface of the substrate block and in the lower surface of the active component.

Item 20. Item 19 in which the seal insert comprises a polymer or fluoropolymer.

Item 21. Any one of items 19-20 in which the seal assembly comprises a seal ring that, when installed, is compressed in the horizontal direction but not in the vertical direction.

Item 22. Any one of items 19-21, in which the secondary tongue and groove structure is a circular groove in one of the upper surface of the substrate block or the lower surface of the active component and a corresponding circular tongue extending from the other of either the upper surface of the substrate block or the lower surface of the active component.

Item 23. Any one of items 19-22 in which the tongue and groove structure comprises a circular structure having a larger diameter than the insert seal.

Item 24. Any one of items 19-23 in which the tongue and groove structure comprises at least two concentric circular tongue and groove structures.

Item 25. Any one of items 19-24 in which the seal comprises a conical center section through which liquid flows when the seal is in place.

Item 26. Item 25 in which the ratio of the height of the cone in the conical center section to the thickness of the seal wall in the conical center section is from about 0.5 to 2.5, such as about 1.0 to 2.0, 1.1 to 1.8, or 1.1 to 1.6.

The invention described herein has broad applicability and can provide many benefits as described and shown in the examples above. The embodiments will vary greatly depending upon the specific application, and not every embodiment will provide all the benefits and meet all the objectives that are achievable by the invention.

Whenever the terms "automatic," "automated," or similar terms are used herein, those terms will be understood to include manual initiation of the automatic or automated process or step. In the discussion and in the claims, the terms "including" and "comprising" are used in an open-ended fashion, and thus should be interpreted to mean "including, but not limited to . . . ." To the extent that any term is not specially defined in this specification, the intent is that the term is to be given its plain and ordinary meaning. The accompanying drawings are intended to aid in understanding the present invention and, unless otherwise indicated, are not drawn to scale. As used herein, the words "right." "left," "lower." "upper." "bottom." "horizontal," "vertical." and the like designate directions in the drawings to which reference is made. These terms are used for convenience only and are not limiting.

Further, it should be recognized that embodiments of the present invention can be implemented via computer hardware or software, or a combination of both. The methods can be implemented in computer programs using standard programming techniques—including a computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

The scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. The figures described herein are generally schematic and do not necessarily portray the embodiments of the invention in proper proportion or scale.

What is claimed is:

1. A method of manufacturing semiconductor devices comprising:
    a) operably coupling a liquid chemical delivery system to a source of liquid chemical, the liquid chemical delivery system comprising:
        a three layer arrangement comprising a top layer of active components, a middle layer of substrate blocks which serve to form fluid connections between the active components, and a bottom layer formed by a back plane serving as a support structure for the top and middle layers;
        the middle layer of substrate blocks comprising first and second substrate blocks, each of the first and second substrate blocks comprising: an upper surface; a substrate inlet port in the upper surface; a substrate outlet port in the upper surface; a substrate fluid passageway extending between the substrate inlet port and the substrate outlet port; and each of the substrate outlet port and the substrate inlet port surrounded by a substrate ring and a substrate channel surrounding the substrate ring;
        the active components comprising a first active component comprising: a lower surface; a component inlet port in the lower surface; a component outlet port in the lower surface; a component fluid passageway extending from the component inlet port to the component outlet port; each of the component inlet port and the component outlet port surrounded by a component ring and a component channel surrounding the component ring;
        first and second seal inserts, each of the first and second seal inserts comprising: an interior sleeve defining a sleeve fluid passageway about an axis; an outer ring connected to and surrounding the interior sleeve so that: (1) an annular upper groove is formed between an upper portion of the outer ring and an upper portion of the interior sleeve; and (2) an annular lower groove is formed between a lower portion of the outer ring and a lower portion of the interior sleeve;
        the first active component bridging the first and second substrate blocks so that: (1) the substrate outlet port of the first substrate block and the component inlet port are aligned; and (2) the substrate inlet port of the second substrate block and the component outlet port are aligned; and
        the first seal insert fluidly sealing the substrate outlet port of the first substrate block and the component inlet port together to form a first fluid connection and the second seal insert fluidly sealing the substrate inlet port of the second substrate block and the component outlet port together to form a second fluid connection, thereby forming a portion of a flow pathway through the liquid chemical delivery system; and
    b) delivering the chemical liquid from the chemical liquid supply through the flow pathway of the liquid chemical delivery system to a process site to process semiconductor wafers;
    wherein the first active component is spaced and isolated from the back plane.

2. The method of claim 1 wherein the first active component is selected from the group consisting of a flow controller, a pressure transducer, a flow measurement sensor, a pressure regulator, a valve, and a flow meter.

3. The method of claim 1 wherein step b) is an etching, cleaning, polishing, drying, or material deposition process.

4. The method of claim 1 wherein the first and second substrate blocks are formed of a polymer or fluoropolymer.

5. The method of claim 4 wherein the first and second substrate blocks are formed of a polypropylene, PTFE, modified PTFE, or PFA.

6. The method of claim 1 wherein step a) further comprises:
    a-1) operably coupling the liquid chemical delivery system to the source of the liquid chemical by forming a liquid connection between an inlet fitting of the liquid chemical delivery system; and
    a-2) operably coupling the liquid chemical delivery system to the process site by forming a liquid connection between an outlet fitting of the liquid chemical delivery system; and
    wherein a portion of the flow pathway from the inlet fitting to the outlet fitting is a weldless and tubeless flow pathway.

7. The method of claim 1 wherein for each of the first and second seal inserts, both the upper and lower portions of the interior sleeve have a tapered outer portion that is sloped away from the sleeve fluid passageway at a first angle relative to the axis.

8. The method of claim 7 wherein for each of the first and second fluid connections, the tapered outer portions of the first and second seal inserts are compressed by the substrate and component rings to form a primary fluid seal at each of the first and second fluid connections.

9. The method of claim 8 wherein for each of the first and second fluid connections, the upper and lower portions of the outer rings of the first and second seal inserts are nested within the component and substrate channels respectively under horizontal interference to form a secondary fluid seal at each of the first and second fluid connections.

10. The method of claim 7 wherein for each of the first and second seal inserts, the interior sleeve has an inner surface extending from an upper edge of the interior sleeve to a lower edge of the interior sleeve that defines the sleeve fluid passageway and is parallel to the axis.

11. The method of claim 7 wherein for each of the first and second seal inserts, both the upper and lower portions of the interior sleeve have a tapered inner portion that is sloped toward the sleeve fluid passageway at a second angle relative to the axis.

12. The method of claim 11 wherein the second angle is greater than the first angle.

13. A method of manufacturing semiconductor devices comprising:
a) operably coupling a liquid chemical delivery system to a source of liquid chemical, the liquid chemical delivery system comprising:
   a three layer arrangement comprising a top layer of active components, a middle layer of substrate blocks which serve to form fluid connections between the active components, and a bottom layer formed by a back plane serving as a support structure for the top and middle layers;
   the middle layer of substrate blocks comprising first and second substrate blocks, each of the first and second substrate blocks comprising: an upper surface; a substrate inlet port in the upper surface; a substrate outlet port in the upper surface; a substrate fluid passageway extending between the substrate inlet port and the substrate outlet port; each of the substrate outlet port and the substrate inlet port surrounded by a substrate ring and a substrate channel surrounding the substrate ring; and the substrate fluid passageway intersecting the substrate inlet port and the substrate outlet port at an angle;
   the active components comprising a first active component comprising: a lower surface; a component inlet port in the lower surface; a component outlet port in the lower surface; a component fluid passageway extending from the component inlet port to the component outlet port; each of the component inlet port and the component outlet port surrounded by a component ring and a component channel surrounding the component ring;
   first and second seal inserts, each of the first and second seal inserts comprising: an interior sleeve defining a sleeve fluid passageway about an axis; an outer ring connected to and surrounding the interior sleeve so that: (1) an annular upper groove is formed between an upper portion of the outer ring and an upper portion of the interior sleeve; and (2) an annular lower groove is formed between a lower portion of the outer ring and a lower portion of the interior sleeve;
   the first active component bridging the first and second substrate blocks so that: (1) the substrate outlet port of the first substrate block and the component inlet port are aligned; and (2) the substrate inlet port of the second substrate block and the component outlet port are aligned; and
   the first seal insert fluidly sealing the substrate outlet port of the first substrate block and the component inlet port together to form a first fluid connection and the second seal insert fluidly sealing the substrate inlet port of the second substrate block and the component outlet port together to form a second fluid connection, thereby forming a portion of a flow pathway through the liquid chemical delivery system; and
b) delivering the chemical liquid from the chemical liquid supply through the flow pathway of the liquid chemical delivery system to a process site to process semiconductor wafers;
wherein the first active component is spaced and isolated from the back plane.

14. The method of claim 13 wherein for each of the first and second seal inserts, both the upper and lower portions of the interior sleeve have a tapered outer portion that is sloped away from the sleeve fluid passageway at a first angle relative to the axis.

15. The method of claim 14 wherein for each of the first and second fluid connections, the tapered outer portions of the first and second seal inserts are compressed by the substrate and component rings to form a primary fluid seal at each of the first and second fluid connections.

16. The method of claim 15 wherein for each of the first and second fluid connections, the upper and lower portions of the outer rings of the first and second seal inserts are nested within the component and substrate channels respectively under horizontal interference to form a secondary fluid seal at each of the first and second fluid connections.

17. The method of claim 14 wherein for each of the first and second seal inserts, the interior sleeve has an inner surface extending from an upper edge of the interior sleeve to a lower edge of the interior sleeve that defines the sleeve fluid passageway and is parallel to the axis.

18. The method of claim 14 wherein for each of the first and second seal inserts, both the upper and lower portions of the interior sleeve have a tapered inner portion that is sloped toward the sleeve fluid passageway at a second angle relative to the axis.

19. The method of claim 18 wherein the second angle is greater than the first angle.

20. The method of claim 13 wherein the substrate fluid passageway comprises an arc, the arc meeting the substrate inlet port and the substrate outlet port.

* * * * *